(12) United States Patent
Otsuka et al.

(10) Patent No.: US 6,175,529 B1
(45) Date of Patent: Jan. 16, 2001

(54) SEMICONDUCTOR INTEGRATED CIRCUIT DEVICE AND METHOD FOR MANUFACTURING THE SAME

(75) Inventors: Hidefumi Otsuka, Takatsuki; Shoji Sakamoto, Kyoto; Yuji Yamasaki, Mishima-gun, all of (JP)

(73) Assignee: Matushita Electric Industrial Co., Ltd., Osaka (JP)

( * ) Notice: Under 35 U.S.C. 154(b), the term of this patent shall be extended for 0 days.

(21) Appl. No.: 09/263,839

(22) Filed: Mar. 8, 1999

(30) Foreign Application Priority Data

Mar. 13, 1998 (JP) .................................................. 10-062745

(51) Int. Cl.[7] .................................................. G11C 29/00
(52) U.S. Cl. ........................... 365/201; 365/200; 365/233
(58) Field of Search ................................... 365/201, 200, 365/233

(56) References Cited

U.S. PATENT DOCUMENTS

| 5,388,104 | * | 2/1995 | Shirotori et al. | ..................... 371/21.1 |
| 5,875,153 | * | 2/1999 | Hii et al. | ............................. 365/233 |
| 5,953,272 | * | 9/1999 | Powell et al. | ........................ 365/201 |
| 5,974,579 | * | 10/1999 | Lepejian et al. | ................. 365/201 X |

FOREIGN PATENT DOCUMENTS 6342040   12/1994  (JP) .

OTHER PUBLICATIONS

Partial English translation of JP 6–342040, dated Dec. 13, 1994.

* cited by examiner

Primary Examiner—Huan Hoang
(74) Attorney, Agent, or Firm—Stevens, Davis, Miller & Mosher, L.L.P.

(57) ABSTRACT

For enabling the self-test of a memory with a small number of input and output pins, and the burn-in tests of a memory and a logic to be carried out simultaneously in a memory/logic circuit mixed system LSI, a test data, an address and a memory control signal required for the test of the memory are generated using the divided-frequency output signal of an address generator, i.e., frequency-divider of an external clock, and a mixer circuit for periodically inverting a pass/fail signal as the test result is provided. This enables the test of the memory with a total of 2 pins of input and output in all. Thus, it becomes possible to test the memory and the logic circuit simultaneously at the time of burn-in test thereof.

22 Claims, 15 Drawing Sheets

SEMICONDUCTOR INTEGRATED CIRCUIT DEVICE AND METHOD FOR MANUFACTURING THE SAME

BACKGROUND OF THE INVENTION

1. Field of the Invention

The present invention relates to a semiconductor integrated circuit device including a semiconductor memory, for example, a DRAM, and having a self-test function of the semiconductor memory, and a semiconductor integrated circuit device such as system LSI having a microcomputer or a logic circuit, and a semiconductor memory in a mixed relationship with each other, and having a self-test function of the semiconductor memory, and the manufacturing method thereof. More particularly, it relates to a memory self-test technique and a burn-in test technique in these semiconductor integrated circuit devices.

2. Prior Art

With recent improvements (implementation of higher density and higher integration) in a semiconductor integrated circuit device, a so-called system LSI in which a plurality of functional blocks are integrated into one chip has become markedly prevalent. Especially, attention has been given to a mixed LSI in which a large-scale logic circuit and a large-scale DRAM are integrated into one chip in recent years. With this trend, there has earnestly been conducted a study of a function circuit for carrying out the self-test of each functional block within the chip (BIST circuit: Built In Self Test circuit).

FIG. 13 shows one example of the configuration of a conventional BIST circuit. This is an example of a BIST circuit for self-testing a large-capacity memory mounted within a chip. Referring to FIG. 13, a data generator 1 generates a test data 3 required for the test of a memory 2, and an expected value data 4 in the test, and supplies the test data 3 to the memory 2, while supplying the expected value data 4 to a data comparison circuit 5.

An address generator 6 generates an address signal 7 required for the test of the memory 2, and supplies it to the memory 2. Also, the address generator 6 supplies address phase information 8 of the address signal 7 to a phase control circuit 9.

The above-described address phase information is a signal which presents, for example, "H (high level)" when the value of the address becomes "0". The address is generated arbitrarily, which necessitates a signal for indicating at which timing the address switches. The signal for indicating the switching of the address is the address phase information 8. It is the phase control circuit 9 which generates memory control signals 11 such as write enable (WE) signal, output enable (OE) signal, row address strobe (RAS) signal, and column address strobe (CAS) signal required for writing to and reading from the memory 2 on the basis of this signal.

The phase control circuit 9 sends data phase information 10 back to the data generator 1 so that the test data 3 and the expected value data 4 are outputted from the data generator 1 at a required timing in accordance with the address signal 7. The phase control circuit 9 also generates the memory control signals 11 such as WE signal, OE signal, RAS signal, and CAS signal required for the test of the writing to and reading from the memory 2, and supplies them to the memory 2.

The data phase information 10 is a signal as described below. That is, a signal required for writing to and reading from the memory 2 is generated on the basis of the signal of the address phase information 8 (ex., a signal which presents "H" when the value of the address becomes "0") at the phase control circuit 9. In this step, the data to be written to the memory 2 and the data to be read from the memory 2 are both required to be generated in accordance with the timing. It is the data phase information 10 which indicates the timing. Data is generated from the data generator 1 on the basis of this signal.

The data generator 1, the address generator 6, and the phase control circuit 9 are capable of generating data of plural kinds of patterns, and are controlled by a mode control circuit 12.

The test of the memory 2 is carried out in the following procedure. That is, the test data 3 is written to the address indicated by the address signal 7 of the memory 2. Thereafter, data is read from the same address of the memory 2. Then, the comparison between the read data, i.e., memory actual output data 13 and the expected value data 4 is performed by the data comparison circuit 5. When the expected value data 4 matches the memory actual output data 13, a pass/fail flag signal 5A outputted from the data comparison circuit 5 has a value indicating the pass state (ex., "L (Low level)", while in the case of mismatch therebetween, the pass/fail flag signal 5A has a value indicating the fail state (ex., "H"). It is noted that, as the test results, the pass/fail flag signal 5A is outputted, and a failed address is also outputted at the time of fail. The failed address denotes the output of the address generator 6 when a fail has occurred, i.e., address data. The procedure varies differently depending on the configuration of a BIST circuit. For example, in the case where the pass/fail flag signal 5A is set to present "H" at the time of fail, and the next address is to be accessed after evaluation, the output obtained by performing an AND operation between the output of the address generator 6 and the pass/fail flag signal 5A can be properly provided.

FIG. 14 shows a block diagram of a logic circuit/DRAM mixed system LSI as semiconductor integrated circuit device. Referring to FIG. 14, a system LSI 100 is comprised of a logic circuit 101, a DRAM 102, selectors 103, 104, 105, 106, 107, and 108 switched by a mode switching signal 14 outputted from the logic circuit 101, input terminals 109, 110, 111, and 112, a clock terminal 113, and output terminals 114 and 115. It is noted that a microcomputer may sometimes be used in place of the logic circuit.

In the system LSI 100 having the above-described configuration, the signals inputted from the input terminals 109 to 112 are supplied to the logic circuit 101, while they are each supplied to its corresponding one of respective input ends of the selectors 103 to 106. Also, a part of the output of the logic circuit 101 is supplied to the other input end of each of the selectors 103 to 106. Of the respective two inputs of the selectors 103 to 106, the ones selected by the mode switching signal 14 are supplied to the DRAM 102 as input. Also, the output of the DRAM 102 is supplied to the one of two input ends of each of the selectors 107 and 108, while the remainder of the output of the logic circuit 101 is supplied to the other of two input ends of each of the selectors 107 and 108. Of the respective two inputs of the selectors 107 and 108, the ones selected by the mode switching signal 14 are supplied to the output terminals 114 and 115, respectively. Further, a clock is supplied in common from the clock terminal 113 to the logic circuit 101 and the DRAM 102. However, it can be properly supplied thereto separately.

In this case, input signals to the DRAM 102 are selected depending on the time of normal operation and the time of test by the mode switching signal 14. Further, as for the output terminal, switching is performed between output from the logic circuit 101 and output from the DRAM 102. Specifically, during the test of the DRAM 102, switching is performed so that the input signals from the input terminals 109 to 112 are given to the DRAM 102, and the output signals of the DRAM 102 are outputted from the output terminals 114 and 115, respectively. On the other hand, at the time of normal operation, the selectors 103 to 106 switch so that signals are inputted from the logic circuit 101 to the DRAM 102, while the selectors 107 and 108 switch so that the signal of the logic circuit 101 is outputted.

However, the circuit configuration cited in Prior Art has the following four problems.

A first problem is as follows: that is, the direct comparison between the expected value data 4 and the memory actual output data 13 is performed in the data comparison circuit 5 to output the pass/fail flag signal 5A. Accordingly, the circuit size increases by multiples of the number of bits with an increase in data bus width (number of bits) of the memory 2.

A second problem is as follows: that is, an increase in data bus width (number of bits) of the memory 2 increases the circuit size of the data comparison circuit 5. Accordingly, there are many gate circuits to be passed between the instant when data is inputted to the data comparison circuit 5 and the instant when the pass/fail flag signal 5A is outputted. Consequently, a long period of time is required for the step between the instant when the memory actual output data 13 is outputted from the memory 2 and the instant when the pass/fail flag signal 5A is produced. This results in a difficulty in testing the memory operating with a high-speed clock at a high speed.

A third problem is as follows: that is, such configuration is adopted so that the pass/fail flag signal 5A outputted from the data comparison circuit 5 is produced as it is from the output terminal as the test result. Accordingly, for example, in the case where the data comparison circuit 5 fails, and only either one of the data "L" indicative of pass, or the data "H" indicative of fail is outputted as pass/fail flag signal 5A, not only the memory test using a circuit for self-test cannot be performed at all, but also a good product may be mistaken for a defective product under certain circumstances.

A fourth problem is as follows: that is, the system LSI as a microcomputer or logic circuit/DRAM mixed semiconductor integrated circuit device has no access-only terminal of the DRAM. Accordingly, in the test of such a system LSI, as shown in FIG. 14, the input signal to the DRAM 102 is required to be switched depending on the time of normal operation and the time of test by the mode switching signal 14. Further, the switching between the output from the logic circuit 101 and the output from the DRAM 102 is required to be achieved as for the output terminals 114 and 115. It is noted that the clock is sharable.

In such a system LSI, when a burn-in test, i.e., a high-temperature bias test is carried out, it is very difficult to share the input pattern between the logic circuit 101 and the DRAM 102. Further, checking of each output data of the logic circuit 101 and the DRAM 102 cannot be performed simultaneously. This is attributable to the following fact; that is, the input pattern for effecting the operation of the DRAM 102 has been previously determined except for the data to be written into the DRAM 102. Accordingly, it is close to impossible to effect the operation of the entire logic circuit 101 with the pattern.

This causes the burn-in tests of the logic circuit 101 and the DRAM 102 to be carried out separately in two steps.

FIG. 15 shows a flowchart of the manufacturing steps of a semiconductor integrated circuit device in the case where the burn-in tests of the logic circuit 101 and the DRAM 102 are carried out separately. Referring to FIG. 15, a step 121 represents a diffusion step for performing a diffusion process and the like; a step 122 represents a probe test step; a step 123 represents an assembly step for performing bonding and the like; a step 124 represents a logic burn-in test step for performing a burn-in test of the logic circuit 101; a step 125 represents a memory burn-in test step for performing a burn-in test of the DRAM 102; a step 126 represents a final test step; a step 127 represents a shipment test step; and a step 128 represents a shipment step.

It is noted that the probe test denotes a test on a wafer, while the final test denotes a test in the state where a LSI chip has been assembled into a package. The final test often becomes an actual shipment test. Also, shipment may sometimes be conducted after carrying out the sampling test following the final test.

SUMMARY OF THE INVENTION

A first object of the present invention is to provide a semiconductor integrated circuit capable of reducing the circuit size.

Further, a second object of the present invention is to provide a semiconductor integrated circuit device capable of facilitating the test under high-speed operation.

Still further, a third object of the present invention is to provide a semiconductor integrated circuit device capable of preventing the mistaking of a good product for a defective product.

Moreover, a fourth object of the present invention is to provide a semiconductor integrated circuit device and the manufacturing method thereof capable of simultaneously conducting the test of a microcomputer or a logic circuit, and the test of a memory to shorten the time required for the test, thereby simplifying the manufacturing process.

A semiconductor integrated circuit device of a first invention comprises: a memory; a memory self-testing address generator; a data generator; a memory control signal generator; and an evaluation circuit. In this case, a self-test circuit is comprised of the memory self-testing address generator, the data generator, the memory control signal generator, and the evaluation circuit, other than the memory.

The memory self-testing address generator generates, upon receipt of an external clock, a memory self-testing address for testing the memory, and provides it to the memory, while it generates a control signal for generating memory self-testing data and a phase signal for generating a memory control signal.

Also, the data generator generates memory self-testing data to be written to the memory in a predetermined data pattern corresponding to the control signal for generating memory self-testing data outputted from the memory self-testing address generator.

The memory control signal generator generates, upon receipt of the phase signal for generating a memory control signal outputted from the memory self-testing address generator, a memory control signal for controlling the write operation of the memory self-testing data to the memory self-testing address of the memory and the read operation of data from the memory self-testing address of the memory.

The evaluation circuit evaluates, based on whether or not the memory actual output data read from the memory self-testing address of the memory becomes the predetermined data pattern corresponding to the control signal for generating memory self-testing data, the pass/fail of the memory actual output data, and outputs a pass/fail flag signal as the evaluation result.

With this configuration, the memory self-testing data to be written to the memory is generated in a predetermined pattern corresponding to the control signal for generating memory self-testing data outputted from the memory self-testing address generator. Then, the pass/fail of the memory actual output data is evaluated based on whether or not the memory actual output data read from the memory self-testing address of the memory matches the predetermined pattern corresponding to the control signal for generating memory self-testing data. That is, the pass/fail of the memory actual output data is not evaluated by the direct comparison between expected value data which is the output of the data generator and the memory actual output data in the evaluation circuit. This enables a reduction in data amount required for evaluating the pass/fail of the memory actual output data. Consequently, it becomes possible to reduce the circuit size of the evaluation circuit, and reduce the number of gates from input to output of the evaluation circuit, thus facilitating the test under high-speed operation.

The semiconductor integrated circuit device of the first invention may further comprises a mixer circuit for periodically inverting the output of the evaluation circuit by the use of the control signal for generating memory self-testing data outputted from the memory self-testing address generator.

With this configuration, the provision of the mixer circuit enables the detection of the fault of the evaluation circuit. Thus, it is indicated whether the memory self-test is being properly performed or not, preventing the mistaking of a good product for a defective product. Further, a fail address can be estimated from the output of the mixer circuit without providing another means for outputting the fail address, simplifying the configuration for the memory self-test.

A description will now be given to the foregoing fact that a fail address can be estimated from the output of the mixer circuit. For example, in the case of a burn-in test, the signal to be periodically inverted is set, for example, so as to start from an address "0", and undergo data inversion at the address maximum value of the memory, thus repeatedly carrying out the test in succession. In this case, the address "0" is accessed immediately after the data changing point. For a good product, the output of the mixer circuit is inverted in a period during which all the addresses have been accessed. However, for a defective product, in the period during which a defective address portion is accessed, the inverted data of that in the case of a good product, that is, if the data in the case of a good product is "H", "L" is outputted. The address is in synchronism with a clock, and the divided-frequency output thereof. Therefore, a fail address can be estimated based on at which timing the inverted data is outputted.

It is noted that the accessing period denotes a period from after the data comparison to the next data comparison.

In the semiconductor integrated circuit device of the first invention, a non-volatile memory may be embedded therein, and the self-test result of the memory may be stored in the non-volatile memory. Further, the above-described mixer circuit may be combined therein.

With this configuration, the test result is stored in the non-volatile memory, and hence the test result becomes available if required. When a defect occurs, for example, a defective address is stored in the non-volatile memory. Then, the reading-out of this is applicable to the observation of the tendency of the defect, and analysis of the defect. Also, it can be stored in the non-volatile memory, and hence a large number of LSIs can be evaluated at the same time automatically, markedly enhancing the efficiency of the defect analysis. When the mixer circuit is combined therein, the function due to the mixer circuit is also obtainable.

In the semiconductor integrated circuit device of the first invention, it may also be configured that, the memory is operated in synchronism with the external clock in normal times, while it is operated in synchronism with the divided-frequency clock obtained by dividing the frequency of the external clock during the memory test. Further, the above-described mixer circuit may also be combined therein.

With this configuration, the test timing or the test frequency can be changed, which enables the test of the memory to be carried out with the memory being under operation at low frequencies using the self-test circuit in the burn-in test, or the like. Thus, the test at low frequencies becomes possible. This can ensure the operation in the self-test under rigorous conditions deviating from normal operation, such as a high-temperature condition observed in the burn-in test. That is, in the test under rigorous conditions deviating from normal operation, it becomes severe to operate at high frequencies, i.e., a high-speed clock, due to the limit of operation of the circuit. Under such conditions, it becomes an object not to ensure the high-speed operation, but to operate the circuit with reliability, and to test it for normal operation. For this reason, the operation is ensured by setting such low frequencies as to ensure the operation from a design viewpoint. When the mixer circuit is combined therein, the function due to the mixer circuit is also obtainable.

In the semiconductor integrated circuit device of the first invention, the evaluation circuit can be implemented by, for example, the logic circuit so configured as to assume one logic state when the memory actual output data is the predetermined data pattern, and to assume the other logic state when the memory actual output data is a data pattern other than the predetermined data pattern.

With this configuration, only inputting of the memory actual output data to the logic circuit can evaluate whether the memory actual output data is the predetermined pattern or not, thereby simplifying the configuration of the evaluation circuit.

In the semiconductor integrated circuit device of the first invention, the predetermined pattern may comprise a first predetermined data pattern, and a second predetermined data pattern obtained by inverting the first predetermined data pattern. In this case, the evaluation circuit can be configured as follows: that is, the evaluation circuit comprises a first logic circuit, a second logic circuit, and a selector. The first logic circuit is so configured as to assume one logic state when the memory actual output data is the first predetermined data pattern, and to assume the other logic state when the memory actual output data is a data pattern other than the first predetermined data pattern. The second logic circuit is so configured as to assume one logic state when the memory actual output data is the second predetermined data pattern obtained by inverting the first predetermined data pattern, and to assume the other logic state when the memory actual output data is a data pattern other than the second predetermined data pattern. The selector selects and outputs any one output of the first and second logic circuits in response to the control signal for generating the memory self-testing data.

With this configuration, only inputting of the memory actual output data to the logic circuit can evaluate whether the memory actual output data is the predetermined pattern or not, thereby simplifying the configuration of the evaluation circuit. Further, an evaluation can be performed each for the first and second predetermined data patterns.

A semiconductor integrated circuit device of a second invention, comprises: a memory circuit; and a microcomputer or a logic circuit for performing reading and writing of data from and to the memory circuit in normal times, and providing a self-test enable signal to the memory circuit at the time of test. Also, the memory circuit is comprised of a memory, a memory self-testing address generator, a data generator, a memory control signal generator, and an evaluation circuit.

The above-described memory self-testing address generator generates, upon receipt of an external clock, a memory self-testing address for testing the memory, and provides it to the memory, while it generates a control signal for generating memory self-testing data and a phase signal for generating a memory control signal.

The data generator generates memory self-testing data to be written to the memory in a predetermined data pattern corresponding to the control signal for generating memory self-testing data outputted from the memory self-testing address generator.

The memory control signal generator receives the phase signal for generating a memory control signal outputted from the memory self-testing address generator, and generates a memory control signal for controlling the write operation of the memory self-testing data to the memory self-testing address of the memory and the read operation of data from the memory self-testing address of the memory.

The evaluation circuit evaluates, based on whether or not the memory actual output data read from the memory self-testing address of the memory becomes the predetermined data pattern corresponding to the control signal for generating memory self-testing data, the pass/fail of the memory actual output data, and outputs a pass/fail flag signal as the evaluation result.

The semiconductor integrated circuit device is so configured that the memory self-testing address generator, the data generator, the memory control signal generator, and the evaluation circuit are activated in response to the self-test enable signal.

With this configuration, the self-test enable signal is outputted form a microcomputer or a logic circuit. In response to the self-test enable signal, the memory self-testing address generator, the data generator, the memory control signal generator, and the evaluation circuit in the memory circuit are activated. Accordingly, the self-test of the memory becomes possible with the control of a small number of terminals. Thus, only by causing the self-test enable signal to be outputted from the microcomputer or the logic circuit during the test of the microcomputer or the logic circuit, the test of the microcomputer or the logic circuit, and the test of the memory circuit can be carried out simultaneously. This enables the shortening of the test time and the simplification of the manufacturing process.

In the semiconductor integrated circuit device of the second invention, the evaluation circuit can be implemented by the logic circuit so configured as to assume one logic state when the memory actual output data is the predetermined data pattern, and to assume the other logic state when the memory actual output data is a data pattern other than the predetermined data pattern.

With this configuration, only inputting of the memory actual output data to the logic circuit can evaluate whether the memory actual output data is the predetermined data pattern or not, thereby simplifying the configuration of the evaluation circuit.

In the semiconductor integrated circuit device of the second invention, the predetermined pattern may comprise a first predetermined data pattern, and a second predetermined data pattern obtained by inverting the first predetermined data pattern. In this case, the evaluation circuit can be configured as follows: that is, the evaluation circuit comprises a first logic circuit, a second logic circuit, and a selector. The first logic circuit is so configured as to assume one logic state when the memory actual output data is the first predetermined data pattern, and to assume the other logic state when the memory actual output data is a data pattern other than the first predetermined data pattern. The second logic circuit is so configured as to assume one logic state when the memory actual output data is the second predetermined data pattern, and to assume the other logic state when the memory actual output data is a data pattern other than the second predetermined data pattern. The selector selects and outputs any one output of the first and second logic circuits in response to the control signal for generating the memory self-testing data.

With this configuration, only inputting of the memory actual output data to the logic circuit can evaluate whether the memory actual output data is the predetermined data pattern or not, thereby simplifying the configuration of the evaluation circuit. Further, an evaluation can be performed each for the first and second predetermined data patterns.

A method for manufacturing a semiconductor integrated circuit device of a third invention is a method characterized in the test of the semiconductor integrated circuit device in the second invention. It is characterized in that a self-test enable signal is provided from the microcomputer or the logic circuit to the memory circuit during the test of the microcomputer or the logic circuit, thereby carrying out the test of the microcomputer or the logic circuit, and the test of the memory circuit simultaneously.

According to this method, the self-test of the memory becomes possible with the control of a small number of terminals.

Thus, only by causing the self-test enable signal to be outputted from the microcomputer or the logic circuit during the test of the microcomputer or the logic circuit, the test of the microcomputer or the logic circuit, and the test of the memory circuit can be carried out simultaneously. This enables the shortening of the test time and the simplification of the manufacturing process.

As described above, according to the present invention, a reduction in size of the circuit for performing the memory self-test, and chip size becomes possible, thereby facilitating the test under high-speed operation. Further, mistaking in the memory test resulting from the failure of the output portion of the circuit for performing the memory self-test can be eliminated, and the selection of a defective address in a small-scale circuit can be facilitated.

Also, the operating frequency during testing can be changed, enabling the operation at low frequencies even under the operating conditions deviating from normal operation such as those in a burn-in test. This can ensure the operation during the burn-in test, improving the reliability of the burn-in test.

Further, in a logic circuit or microcomputer/DRAM mixed system LSI, the burn-in test can be completed in one step. Consequently, in the manufacturing of the system LSI, the shortening of the burn-in test and the simplification of the test, and the simplification of the manufacturing process become possible.

DESCRIPTION OF THE PREFERRED EMBODIMENTS

First Embodiment

Figure 1:
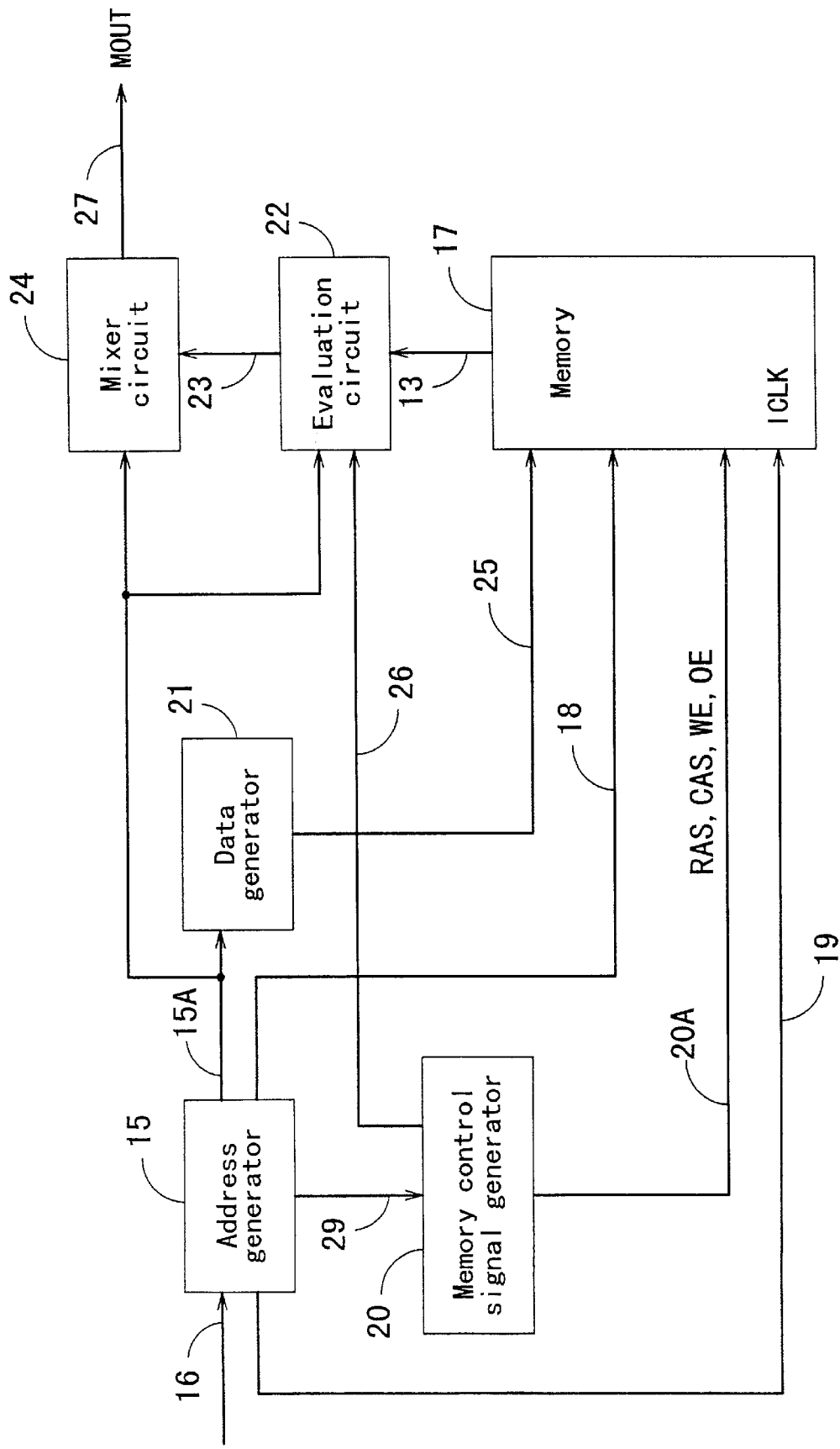
FIG. 1 is a block diagram showing the configuration of a semiconductor integrated circuit device having a memory self-test circuit in a first embodiment of the present invention.

FIG. 1 shows the basic configuration of a semiconductor integrated circuit device of a first embodiment of the present invention. The semiconductor integrated circuit device denotes a DRAM including therein a self-test circuit comprised of components other than a memory in FIG. 1, and operating in synchronism with an external clock. Referring to FIG. 1, an address generator 15 for a memory self-test is comprised of a plurality of counters, whereby counting up or counting down is performed with an external clock 16, and the count output of each counter is outputted from the address generator 15 in the following manner.

That is, the address generator 15 generates a memory self-testing address 18 made of a row address and a column address for testing a memory 17, and provides it to the memory 17. It also generates an internal clock (ICLK) 19 for operating the memory 17, and supplies it to the memory 17. It also generates a phase signal 29 for generating a memory control signal, and supplies it to the memory control signal generator 20. Further, it generates a control signal 15A for generating memory self-testing data, and supplies it to a data generator 21, an evaluation circuit 22 for evaluating the pass/fail of the memory actual output data 13 from the memory 17, and a mixer circuit 24 for periodically inverting the pass/fail flag signal 23 which is the output data from the evaluation circuit 22.

The data generator 21 receives the data outputted from the address generator 15, i.e., the control signal 15A for generating memory self-testing data, and generates an input data 25 for a memory self-test with a desired data pattern to be written into a given address of the memory 17. The input data 25 required for the memory test actually becomes a repetition of a simple data pattern, and hence it can be implemented with a combination of several bits of the output data of the address generator 15. The detailed examples of the circuit of the data generator 21 will be described later.

The memory control signal generator 20 receives the phase signal 29 for generating a memory control signal outputted from the address generator 15, and generates a memory control signal 20A for controlling the operation of writing the input data 25 into the memory 17 and the operation of reading the data from the memory 17. Examples of the memory control signal 20A include a row address strobe (RAS) signal, a column address strobe (CAS) signal, a write enable (WE) signal and an output enable (OE) signal.

The evaluation circuit 22 evaluates the pass/fail of the memory actual output data 13 based on whether or not the memory actual output data 13 becomes a predetermined data pattern corresponding to the control signal 15A for generating memory self-testing data. Then, it outputs the pass/fail flag signal 23 as the evaluation result. If the memory actual output data 13 becomes a predetermined data pattern, the pass/fail flag signal 23 presents "L", while if not, it presents "H". The pass/fail flag signal 23 outputted from the evaluation circuit 22 is latched by a data-holding clock (DCLK) 26 which is the output data from the memory control signal generator 20, and held until the data comparison of the memory cell of the next address.

The evaluation circuit 22 described above is configured as follows. That is, it is noticed that the input data 25 required for the memory test is not a random data pattern, but a repetition of a simple pattern. Then, making use of the regularity of the pattern, a logic circuit for pattern evaluation corresponding to a plurality of predetermined data patterns has previously been formed within the evaluation circuit 22, whereby any data pattern is selected on the basis of the control signal 15A for generating memory self-testing data.

Therefore, it is so contrived that even if an expected value data corresponding to the memory actual output data 13 is not inputted to the evaluation circuit 22 at every step, the match or mismatch between the memory actual output data 13 and a predetermined data pattern can be evaluated. Thus, an attempt to reduce the circuit size has been achieved as compared with the case where a memory actual output data and an expected value are inputted to a data comparison circuit to perform the direct comparison therebetween as in the prior art example. It is noted that the predetermined data pattern is data corresponding to the expected value data in the prior art example. The circuit configuration of the evaluation circuit 22 will be described in detail later.

Figure 2:
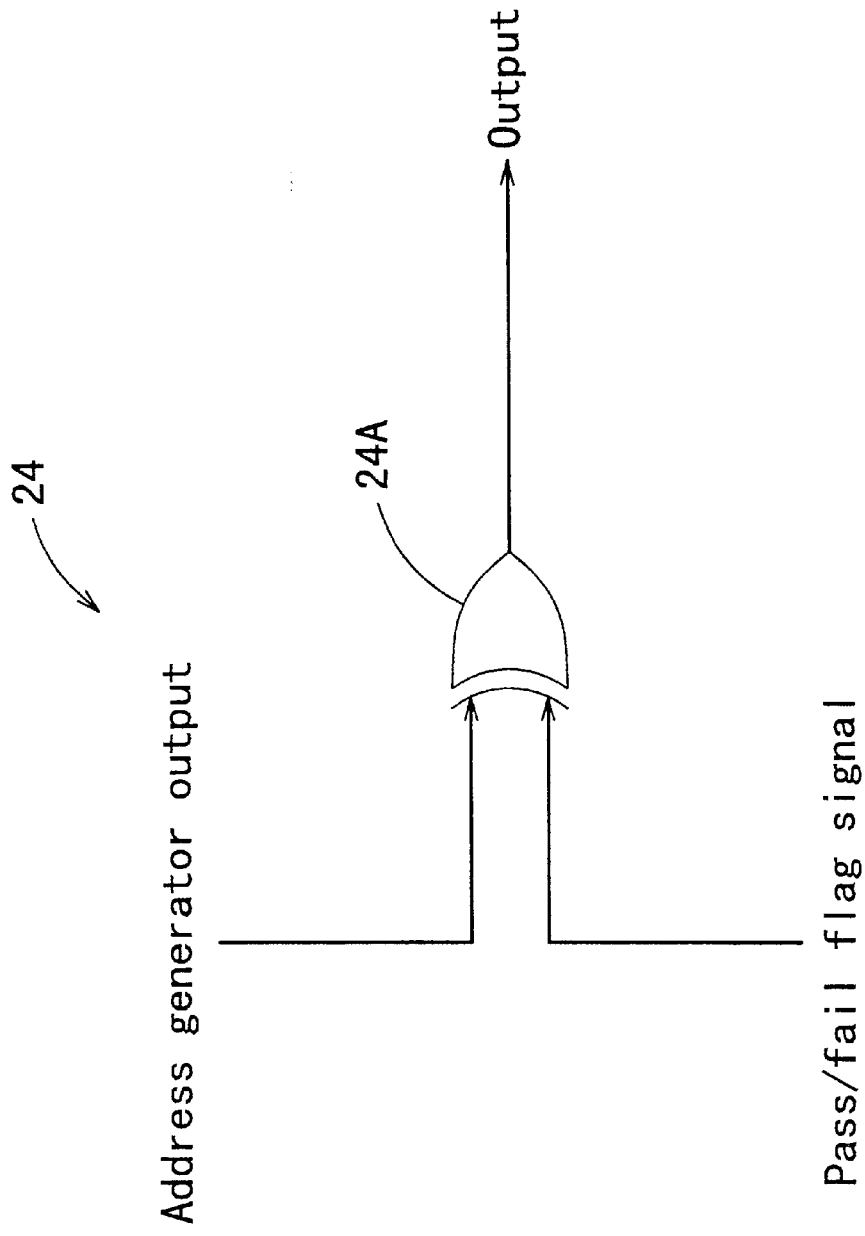
FIG. 2 is a block diagram showing the configuration of a mixer circuit in the semiconductor integrated circuit device of the first embodiment of the present invention.

The mixer circuit 24 receives the one bit of the counter output of the address generator 15 as input data, and generates output data (MOUT) 27 obtained by periodically inverting the pass/fail flag signal 23 which is the output data of the evaluation circuit 22. Referring now to FIG. 2, the circuit configuration of the mixer circuit 24 is comprised of an exclusive-OR circuit 24A which receives the counter output of the address generator 15 and the pass/fail flag signal 23. Addition of the mixer circuit 24 enables the pass/fail flag signal 23 which is the output of the evaluation circuit 22 to be periodically inverted by the use of the control signal 15A for generating memory self-testing data outputted from the address generator 15. This enables the guarantee of the internal test circuit and the selection of a fail address.

The guarantee of the internal test circuit is performed in the following manner. That is, if the output of the exclusive-OR circuit 24A is periodically inverted, it can be confirmed that the internal test circuit is operating normally.

Also, the selection of the fail address of a memory cell is performed in the following manner. That is, for a good product, the inverted data is periodically outputted, while if there is a fail address, the output occurs without periodicity at the timing of having accessed the portion, i.e., its address. Specifically, for example, "L" is outputted during the period of outputting "H".

Then, for example, the inversion period of periodically inverting data is set to a period for accessing the overall addresses. This enables the selection of a fail address based on a difference between periodically changing timing and non-periodically changing timing.

With the provision of the self-test circuit as described above, only the addition of an input terminal for starting the test and an output terminal for outputting the test result enables the test of a memory to be carried out.

A concrete description will now be given to the circuit configuration of each circuit block of the semiconductor integrated circuit device shown in FIG. 1.

In the case where the input data 25 for the memory test is simple, the evaluation circuit 22 can perform the data comparison, that is, can evaluate whether the memory actual output data 13 becomes a predetermined data pattern, or not, with the configuration of less circuits as compared with that of the prior art example. Thus, the formation of a circuit corresponding to a predetermined data pattern within the evaluation circuit 22 eliminates the necessity of inputting an expected value data from the outside to the evaluation circuit 22. This enables the bus width of the evaluation circuit 22 for the comparison between the memory actual output data and the expected value in the memory test to be reduced in half. This in turn enables the reduction in chip size.

Below, a concrete description will now be given to the address generator 15, the data generator 21, and the evaluation circuit 22 in the case where the predetermined pattern is a checker pattern to be required for the memory test by reference to drawings.

Figure 3:
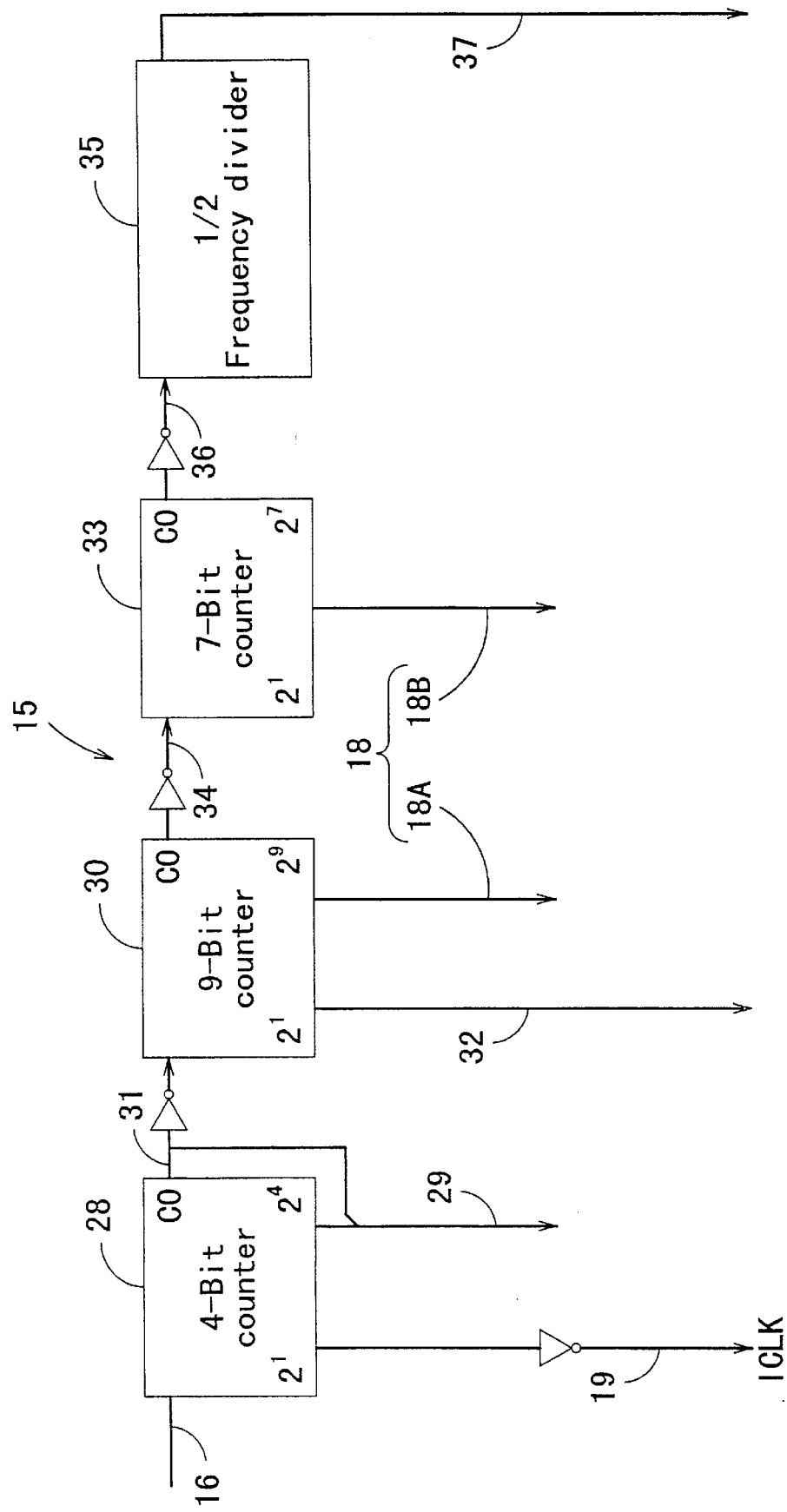
FIG. 3 is a block diagram showing the configuration of an address generation circuit in the semiconductor integrated circuit device of the first embodiment of the present invention.

FIG. 3 is a block diagram showing the configuration of the address generator 15 for counting up. Referring to FIG. 3, a 4-bit counter 28 is an up counter for dividing the frequency of the external clock 16 by 16, and generates a phase signal 29 required for the generation of the internal clock (ICLK) 19 for DRAM operation and signals for DRAM control (RAS signal, CAS signal, WE signal, OE signal, and the like). It is noted that the internal clock 19 for DRAM operation is obtained by dividing the frequency of the external clock 16 by half. When the memory 17 is operated on the basis of the internal clock 19, the memory 17 goes into a lower-speed operation mode as compared with the case in normal times when operating with the external clock 16.

A 9-bit counter 30 performs counting up of a carry out signal 31 of the 4-bit counter 28, and generates 9-bit row address data 18A, and a pattern control signal 32 (the least significant bit of the 9-bit counter 28) for generating a checker pattern.

A 7-bit counter 33 performs counting up of a carry out signal 34 of the 9-bit counter 30, and generates 7-bit column address data 18B, which is then supplied to the memory 17 with the row address 18A of the 9-bit counter 30 as address 18. A ½ frequency divider 35 outputs data having a frequency (duty=50) one-half that of a carry out signal 36 of the 7-bit counter 33. The output data is the data changing at a period of accessing the total addresses (total row addresses+ total column addresses) of the memory to be tested, and outputted as a back pattern control signal 37 for generating the back pattern of the checker pattern, i.e., generating the inverted pattern of the first pattern.

Figure 4:
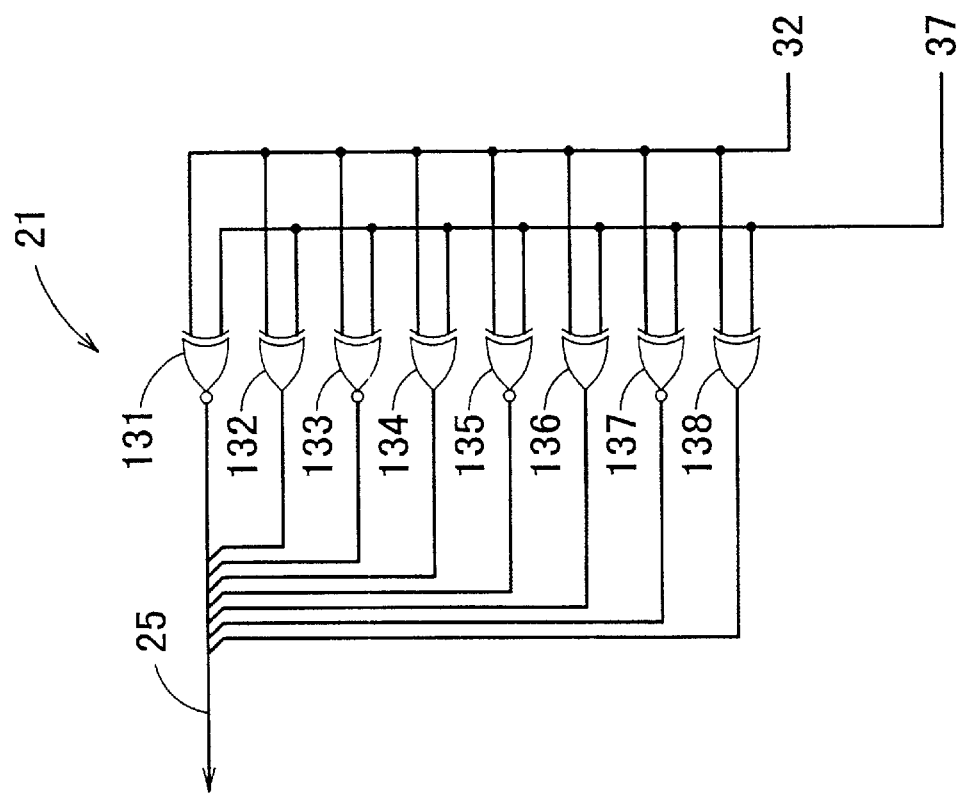
FIG. 4 is a block diagram showing the configuration of a data generator in the semiconductor integrated circuit device of the first embodiment of the present invention.

FIG. 4 is a block diagram showing the circuit configuration of the data generator 21 for generating a checker pattern of 8-bit data. Referring to FIG. 4, the data generator 21 consists of exclusive-NOR circuits 131, 133, 135, and 137, and exclusive-OR circuits 132, 134, 136, and 138. The input data to respective exclusive-NOR circuits 131, 133, 135, and 137, and respective exclusive-OR circuits 132, 134, 136, and 138 are the pattern control signal 32 and the back pattern control signal 37 which are the output data of the address generator 15.

With this circuit configuration, the outputs of respective exclusive-OR circuits 132, 134, 136, and 138 alternate with the outputs of respective exclusive-NOR circuits 131, 133, 135, and 137, respectively, for every adjacent bits of the output data of the data generator 21. This results in the input data 25 to the memory 17 in which every adjacent bits are mutually inverted data, which causes the data to be written in a checkerboard pattern on a memory cell. For example, when the input data to one memory cell is "10101010", each input data to the memory cells each vertically and horizontally adjacent the memory cell is "01010101". Also, at the time of next test, the input data to each memory cell assumes exactly inverted pattern of that in this step.

Figure 5:
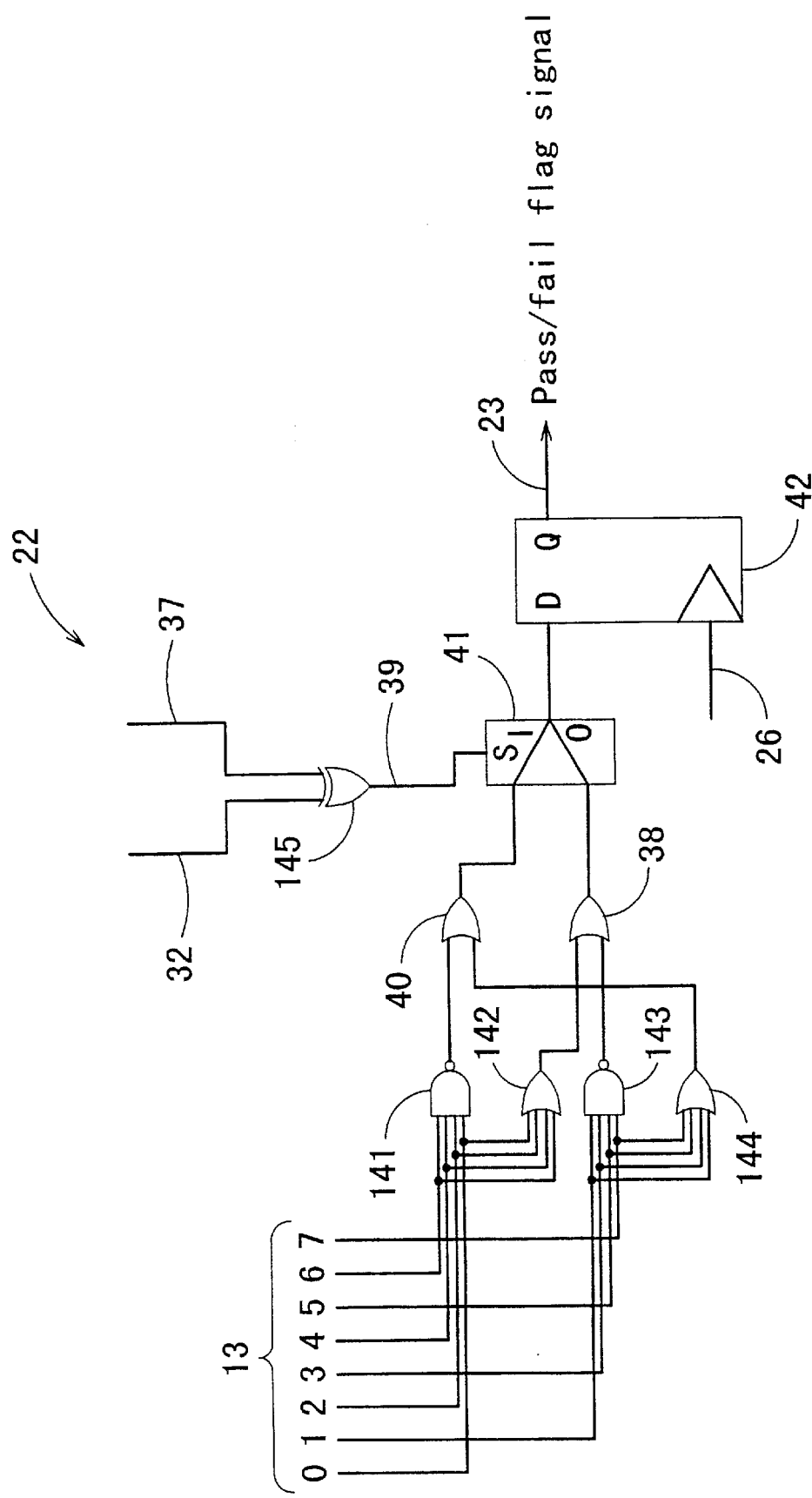
FIG. 5 is a block diagram showing the configuration of an evaluation circuit in the semiconductor integrated circuit device of the first embodiment of the present invention.

FIG. 5 is a block diagram showing the circuit configuration of the evaluation circuit 22. Referring to FIG. 5, in the evaluation circuit 22, the memory actual output data 13 is inputted to a NAND circuit 141, an OR circuit 142, a NAND circuit 143, and an OR circuit 144. It is noted that the numerals of 0 through 7 given on the respective input ends of the NAND circuits 141 and 143, and the OR circuits 142 and 144 each denote the numbers of the respective bits of the memory actual output data 13. The less numeral denotes a lower bit. The output signals of the NAND circuits 141 and 143, and the OR circuits 142 and 144 are inputted to a D flip-flop via OR circuits 38 and 40, and a selector 41. The selector 41 is controlled by a select signal 39 which is the output of an exclusive-OR circuit 145.

With this circuit configuration, in the case where the memory test result is pass when the input data 25 to the memory 17 is "01010101" from its lower bit, the output of the OR circuit 38 is "0", while it is "1" when the result is fail. At this step, by the select signal 39 generated in the exclusive-OR circuit 145 on the basis of the pattern control signal 32 and the back pattern control signal 37, i.e., input data from the address generator 15, the output of the OR circuit 38 is selected in the selector 41 to be outputted as pass/fail flag signal.

Also, in the case where the memory test result is pass when the input data 25 to the memory 17 is "10101010" from its lower bit, the output of the OR circuit 40 is "0", while it is "1" when the result is fail. At this step, by the select signal 39 generated in the exclusive-OR circuit 145 on the basis of the pattern control signal 32 and the back pattern control signal 37, i.e., input data from the address generator 15, the output of the OR circuit 40 is selected in the selector 41 to be outputted as pass/fail flag signal.

As for the final output of the evaluation circuit 22, the output signal produced by latching the output of the selector 41 in the D flip-flop 42 is used as the pass/fail flag signal 23. As the clock signal of the D flip-flop, a data holding clock (DCLK) 26 which is the output data of the memory control signal generator 20 is used.

With such a circuit configuration, it becomes possible to reduce by half the bus width of the input of the evaluation circuit 22 in the memory test. This enables a reduction in circuit size and wiring area within a chip, thus enabling a reduction in chip size as well as number of stages of gates through which signals from input to output of the evaluation circuit 22 pass. Consequently, a test under high-speed operation can be facilitated.

Figure 6:
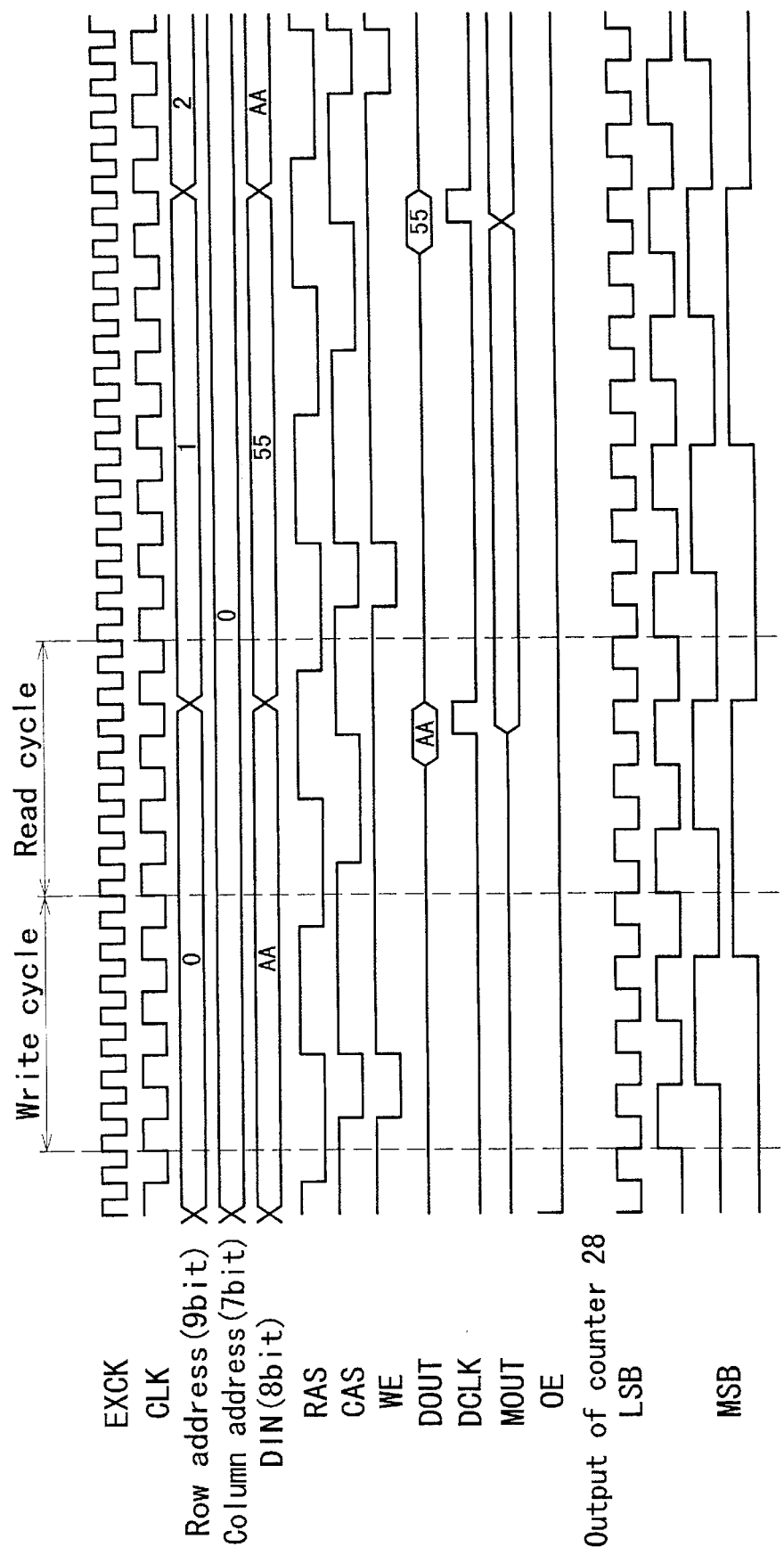
FIG. 6 is a timing chart of the semiconductor integrated circuit device of the first embodiment of the present invention.

FIG. 6 is a timing chart of a memory self-test in the first embodiment. In the figure, there are shown an external clock (EXCK), an internal clock (ICLK), a 9-bit row address, a 7-bit column address, 8-bit input data (DIN), memory actual output data (DOUT), a RAS signal, a CAS signal, a WE signal, and an OE signal, i.e., the output data of the memory control signal generator 20, the data holding clock (DCLK) 26, the output data (MOUT) of the mixer circuit 24, and the counter 28.

It is noted that, in the example of FIG. 3, the one-half divided-frequency inverted output of the 4-bit counter 25 has been used as the internal clock (ICLK) 19, thus dividing the operating frequency into half to sufficiently ensure the operating margin. This can implement the guarantee of the high-temperature operation during a burn-in test.

It is noted that the mixer circuit may be properly omitted.

Second Embodiment

Next, a description will now be given to a second embodiment of the present invention in which a write operation for storing the memory self-test result in a non-volatile memory is to be performed by taking, for example, the case where the self-test of a DRAM is performed by the use of a memory self-test circuit in which the write and read cycles are both comprised of 4 cycles.

Figure 7:
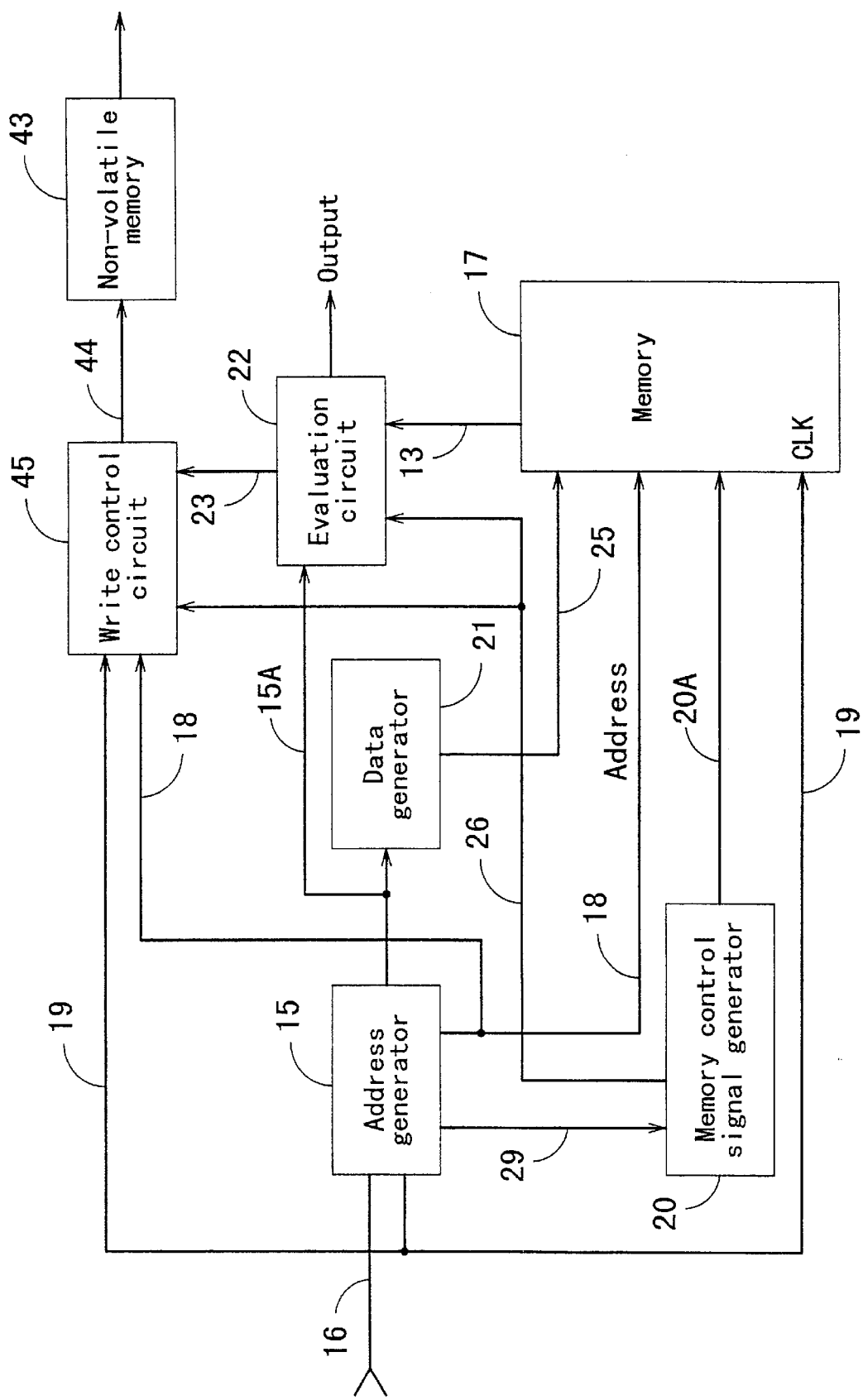
FIG. 7 is a block diagram showing the configuration of a semiconductor integrated circuit device having a memory self-test circuit in a second embodiment of the present invention.

FIG. 7 shows a schematic diagram of a semiconductor integrated circuit of the second embodiment, wherein like parts are identified by like reference characters as in FIG. 1. Referring to FIG. 7, it is so configured that, to the configuration shown in FIG. 1, are added a non-volatile memory 43 for storing the test result, and a write signal 44 required for writing it to the non-volatile memory 43, and is further added a write control circuit 45 which receives the internal clock 19 and the address 18 generated from the address generator 15, the pass/fail flag signal 23 generated from the evaluation circuit 22, and the data holding clock 26, and generates a write signal 44. It is noted that examples of the write signal 44 include write data, address, and write enable signal.

In this case, if the entire pass/fail flag signal 23 is written into the non-volatile memory 43 just as it is, the same capacity as the memory capacity of the memory 17 to be tested becomes necessary at the minimum, thus being impractical. Then, in this second embodiment, there is proposed the system whereby only a failed system is written into the non-volatile memory 43 as data.

Figure 8:
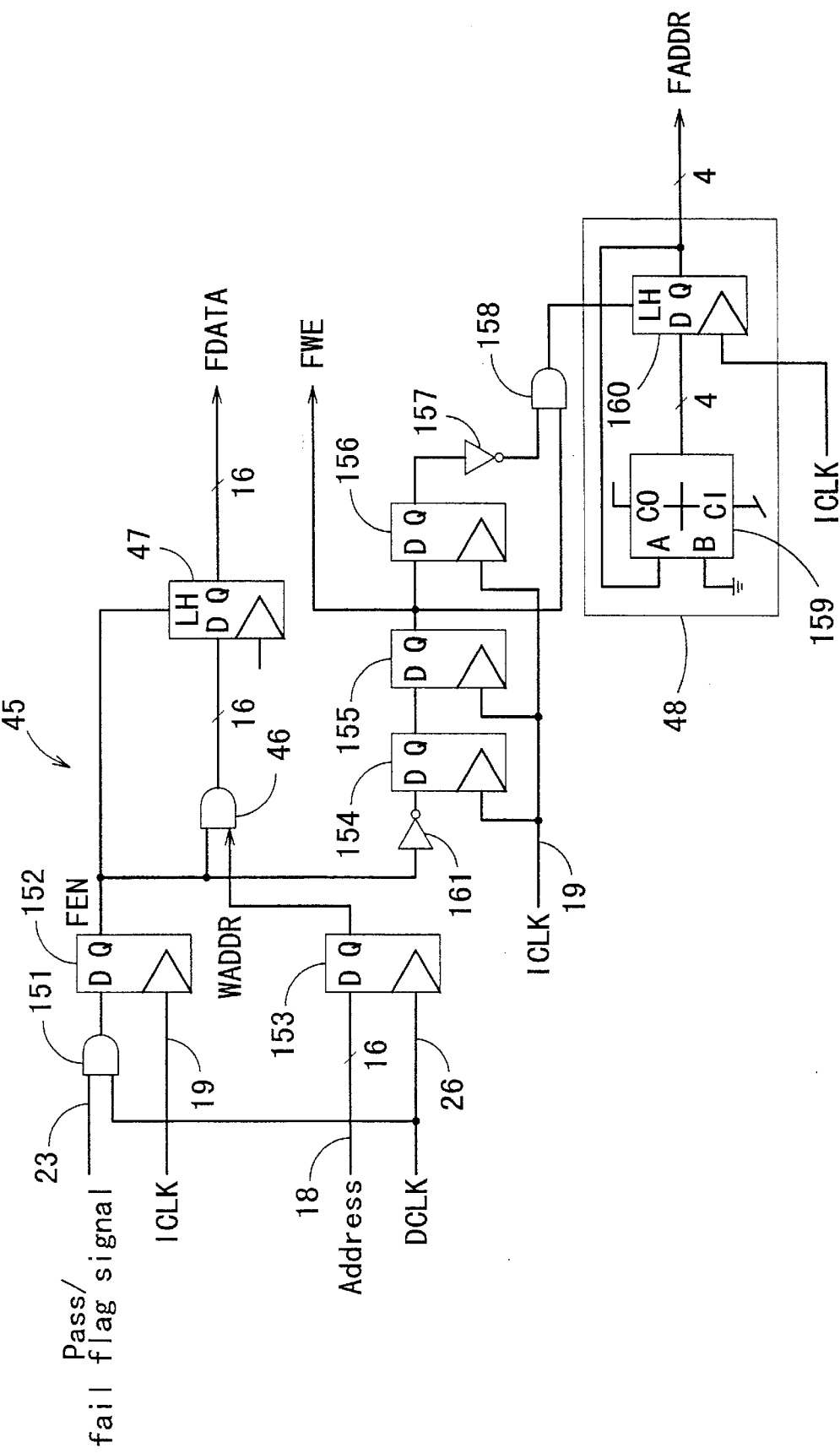
FIG. 8 is a block diagram showing the configuration of a write control circuit in the semiconductor integrated circuit device of the second embodiment of the present invention.

FIG. 8 is a block diagram showing an example of the configuration of the write control circuit 45 in the case where it is assumed that the address of the DRAM to be self-tested is formed of 16 bits, that is, the total of row address and column address is formed of 16 bits, and the number of fails which can be written is 16. Referring to FIG. 8, the write control circuit 45 is comprised of an AND circuit 151, D flip-flops 152 and 153, D flip-flops 154 to 156, inverting circuits 157 and 161, an AND circuit 158, an AND circuit 46, a load hold type flip-flop 47, and an address counter 48-. The address counter 48 is comprised of a full adder circuit 159 and a load hold type flip-flop 160.

Below, a description will now be given to the operation of the write control circuit 45. In the configuration of FIG. 8, the polarity of the pass/fail flag signal 23 is assumed to be "H" at the time of fail. The AND of the pass/fail flag signal 23 and the data holding clock 26 by the AND circuit 151 is held in the D flip-flop 152 at the timing of the internal clock (ICLK) 19. The output of the D flip-flop 152 becomes a fail enable signal FEN to be a load hold control signal of the load hold type flip-flop 47. Also, the address 18 at this step is held in the D flip-flop 153 at the timing of the data holding clock 26. The output of the D flip-flop 153 becomes a write address WADDR, which is then inputted together with the fail enable signal FEN outputted from the D flip-flop 152 into the AND circuit 46.

The AND circuit 46 is for extracting only the failed address, and transmitting it to the load hold type flip-flop 47. The address at the time of fail is held in the load hold type flip-flop 47 to be used as write data FDATA.

The write enable signal FEW for controlling the writing to the non-volatile memory is also generated by the use of the D flip-flops 152, 154, and 155, the inverting circuit 161, and the like on the basis of the pass/fail flag signal 23. This allows the address data to be written into the non-volatile memory 43 at the timing of the occurrence of fail.

Also, it is so configured that on the basis of the write enable signal FEW, the D flip-flop 156, the inverting circuit 157, the AND circuit 158 and the like are used to effect the counting up of the address counter 48. This enables the implementation of the configuration whereby the write address FADDR of the non-volatile memory 43 is advanced after the completion of data writing. The address counter 48 counts the internal clock 19 after the completion of data writing. For example, it is a 4-bit counter, and hence the number of addresses is 16. Therefore, the number of fails up to 16 can be stored in the non-volatile memory 143. This number of bits is not limited to 4 bits. The number of bits of the address counter 48 can properly be adjusted in accordance with the capacity of the non-volatile memory 43.

A description will now be given to the operation of the address counter 48. The address counter 48 is a counter which counts the number of pulses of the internal clock (ICLK) for the period during which "H" is being inputted to the L/H signal input terminal of the load hold type flip-flop 160. The full adder circuit 159 is a circuit which performs a 4-bit full addition, and outputs the sum of input signals A and B, and a carry in signal CI. The carry out signal CO is a signal at a fifth bit which outputs "H" when on performing an operation of addition, the result does not fall within 4 bits, and a carry into a fifth bit occurs. In the case of the operation of the address counter 48, the carry out signal CO is not necessary. The "H" is inputted to the carry in signal CI to set the input signal B at "0", thereby implementing the operation of A+1.

Figure 9:
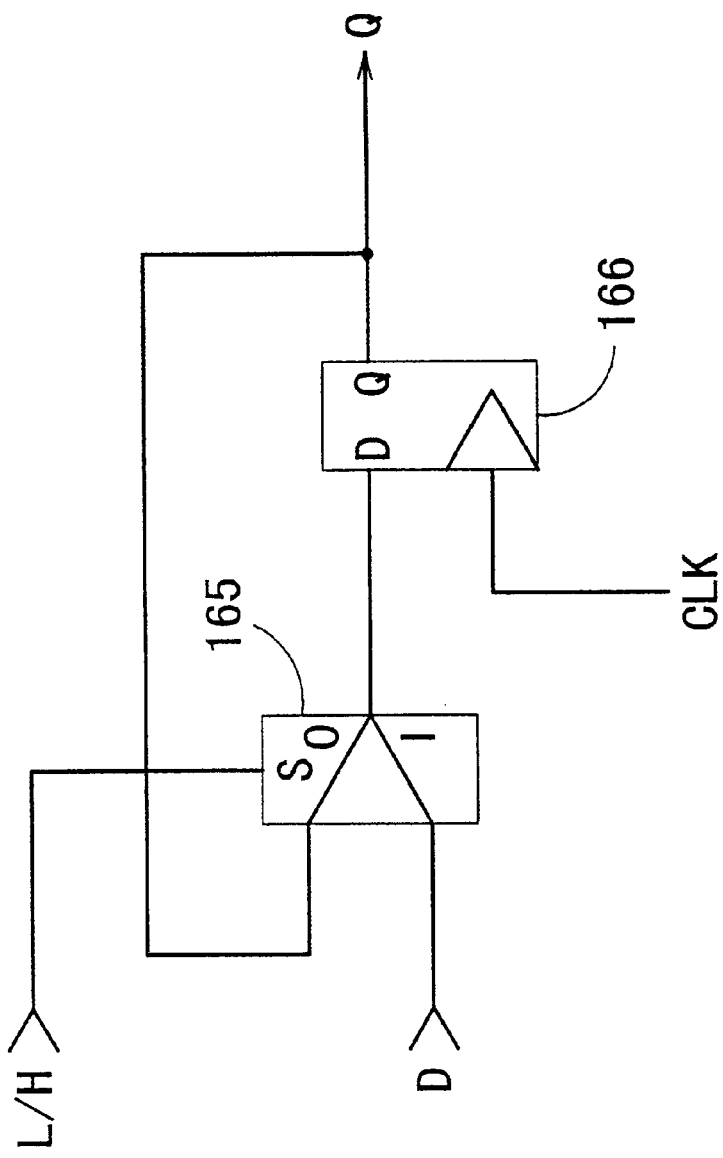
FIG. 9 is a block diagram showing the configuration of a load hold type D flip-flop in the semiconductor integrated circuit device of the second embodiment of the present invention.

FIG. 9 is a block diagram showing the configuration of the load hold type flip-flop. The load hold type flip-flop is comprised of a D flip-flop 166 which receives a clock (CLK) as a clock input, and a selector 167 which receives a load hold signal (L/H signal) as a switching control input. Whether the data input signal (D signal) or the output signal (Q signal) of the D flip-flop 167 is selected on the basis of the load hold signal (L/H signal), which is then used as the D input signal of the D type flip-flop 167. The load hold type flip-flop has such a function that the D signal when the load hold signal (L/H signal) is "H" is held for the period during which the load hold signal (L/H signal) is "L" in synchronism with the clock (CLK).

Figure 10:
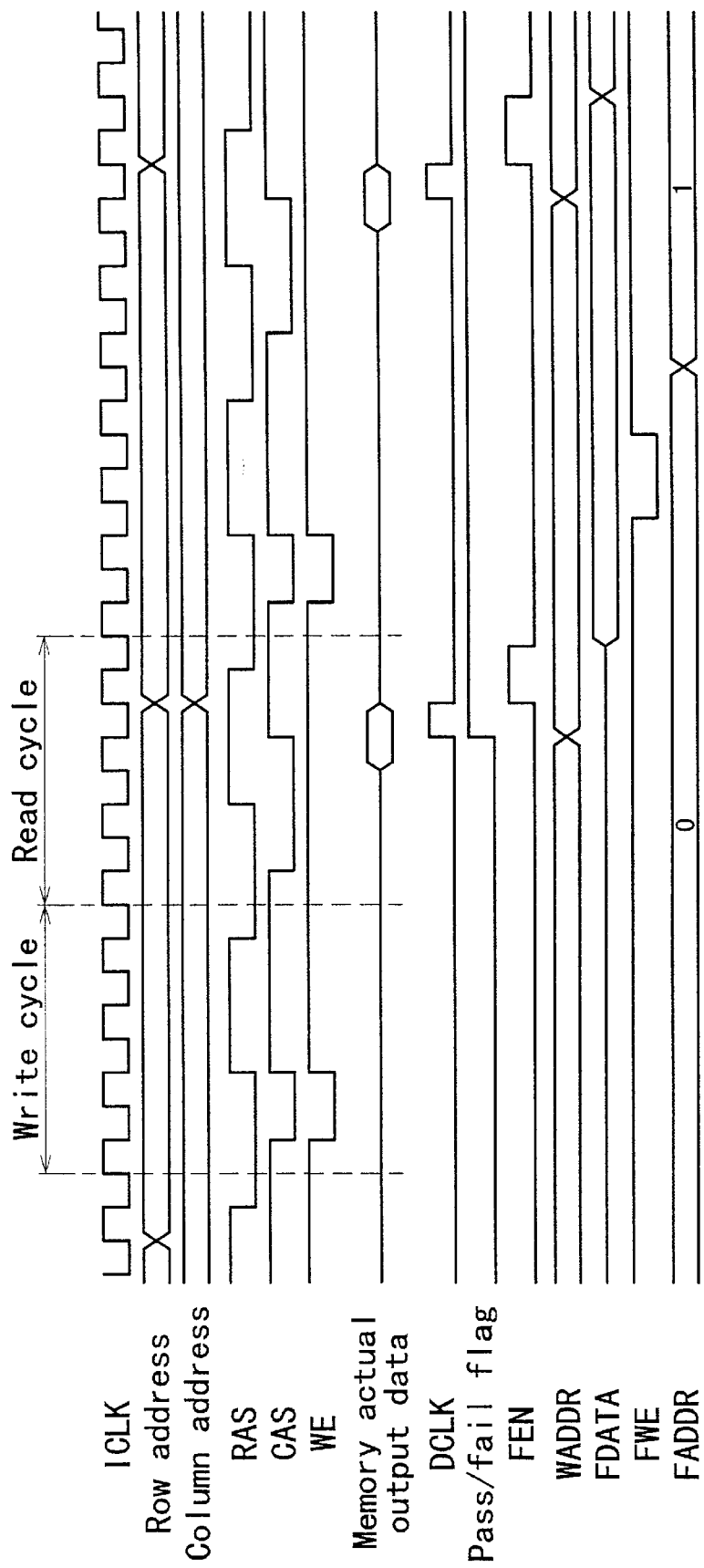
FIG. 10 is a timing chart of the semiconductor integrated circuit device in the second embodiment of the present invention.

FIG. 10 is a timing chart of the write control circuit 45. The example shows the case where fails successively occur in the self-test of a DRAM in which the read cycle includes 4 cycles. Referring to FIG. 10, there are shown an internal clock (ICLK), a row address, a column address, a RAS signal, a CAS signal, a WE signal, the memory actual output data 13 of the memory 17, a data holding clock (DCLK), a pass/fail flag signal, a fail enable signal, a write address WADDR, a write data FDATA, a write enable signal FEW, and a write address FADDR. The above-described memory actual output data 13 is written into the non-volatile memory 43 in the case where the evaluation results of the control signal 15A for generating memory self-testing data is determined to be defective.

As described above, the configurations shown in FIGS. 7, 8, and 9 enable the fail address to be automatically written into the non-volatile memory 43 embedded therein at the time of the self-test.

It is noted that the mixer circuit has been omitted in the above second embodiment, however, it can properly be provided.

Third Embodiment

In the burn-in test of the system LSI as a semiconductor integrated circuit device in which a microcomputer or a logic circuit and a DRAM are mixed, the use of the self-test circuit shown in the first embodiment of the present invention enables as follows: that is, two steps of the burn-in test have been required for the microcomputer or the logic circuit, and the DRAM at the minimum in the prior art. However, it becomes possible to carry out the burn-in tests of the microcomputer or the logic circuit, and the DRAM simultaneously. Thus, the burn-in tests of the microcomputer or the logic circuit, and the DRAM can be completed in one step.

Figure 11:
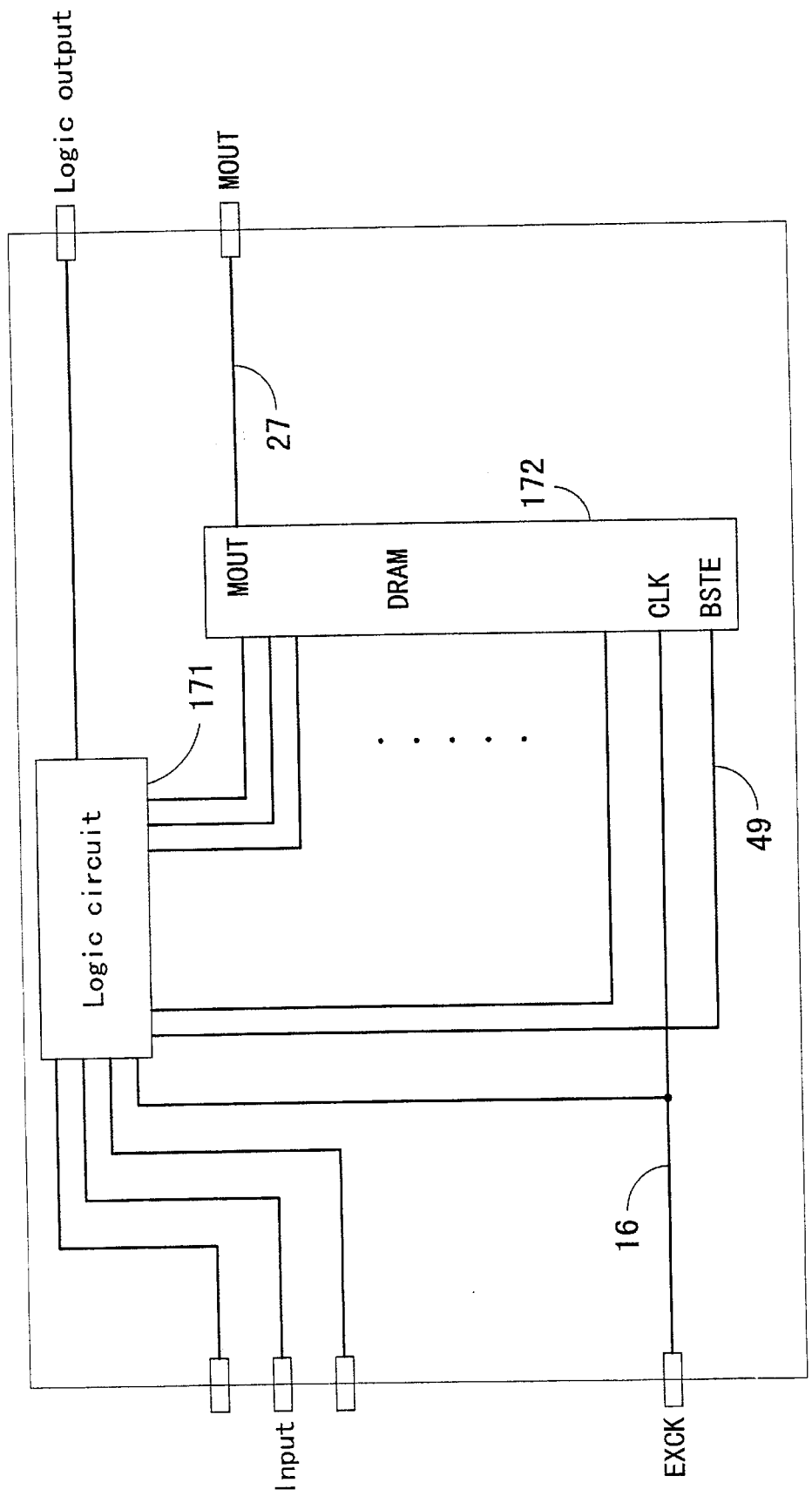
FIG. 11 is a schematic diagram showing the configuration of a system LSI in a third embodiment of the present invention.

The schematic diagram of the system LSI of this embodiment is shown in FIG. 11. FIG. 11 shows the flows of the input signals and the output signals within the LSI at the time of burn-in test in simplified form. Referring to FIG. 11, the external clock (EXCK) 16 is supplied to both of a logic circuit 171 and a DRAM 172. The input pins other than this are used as input for the burn-in test of the logic circuit 171. In this step, a self-test enable signal (BSTE signal) 49 for effecting the operation of the self-test circuit provided within the DRAM 172 is supplied from the logic circuit 171 to the DRAM 172. It is noted that the above-described self-test circuit is the same as that shown in FIG. 1.

The DRAM 172 receives the self-test enable signal 49 to generate a self-testing pattern on the basis of the external clock 16, and outputs the test result as output data 27. The output data 27 can properly be extracted from an output pin. It is noted that the DRAM 172 is so configured as to activate the same memory self-testing address generator, data generator, memory control signal generator, and evaluation circuit as those shown in FIG. 1 in response to the self-test enable signal 49.

Thus, the self-test enable signal 49 is caused to be outputted from the logic circuit 171, and one pin for outputting the output data 27 is added thereto. Only this enables the burn-in tests of the logic circuit 171 and the DRAM 172 to be carried out simultaneously. It is noted that there has been described above the case where the logic circuit 171 is embedded therein, however, the same holds true for the case where a microcomputer is embedded therein.

Figure 12:
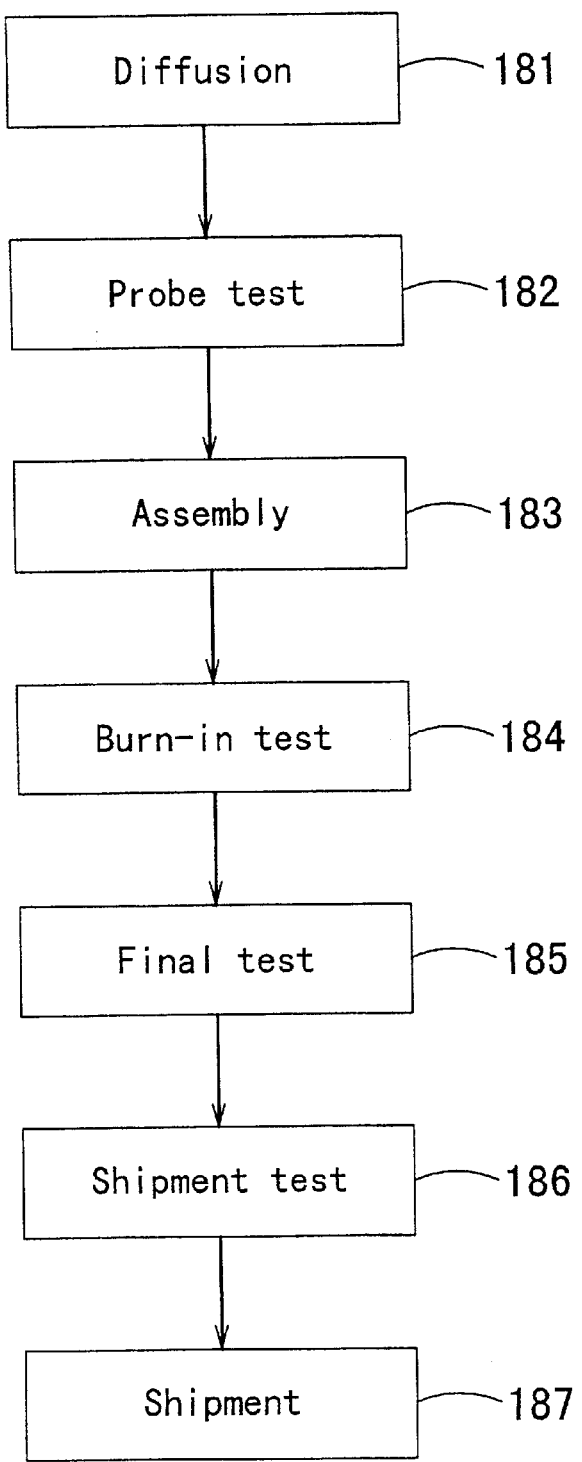
FIG. 12 is a flowchart showing the manufacturing process of the system LSI in the third embodiment of the present invention.
Figure 13:
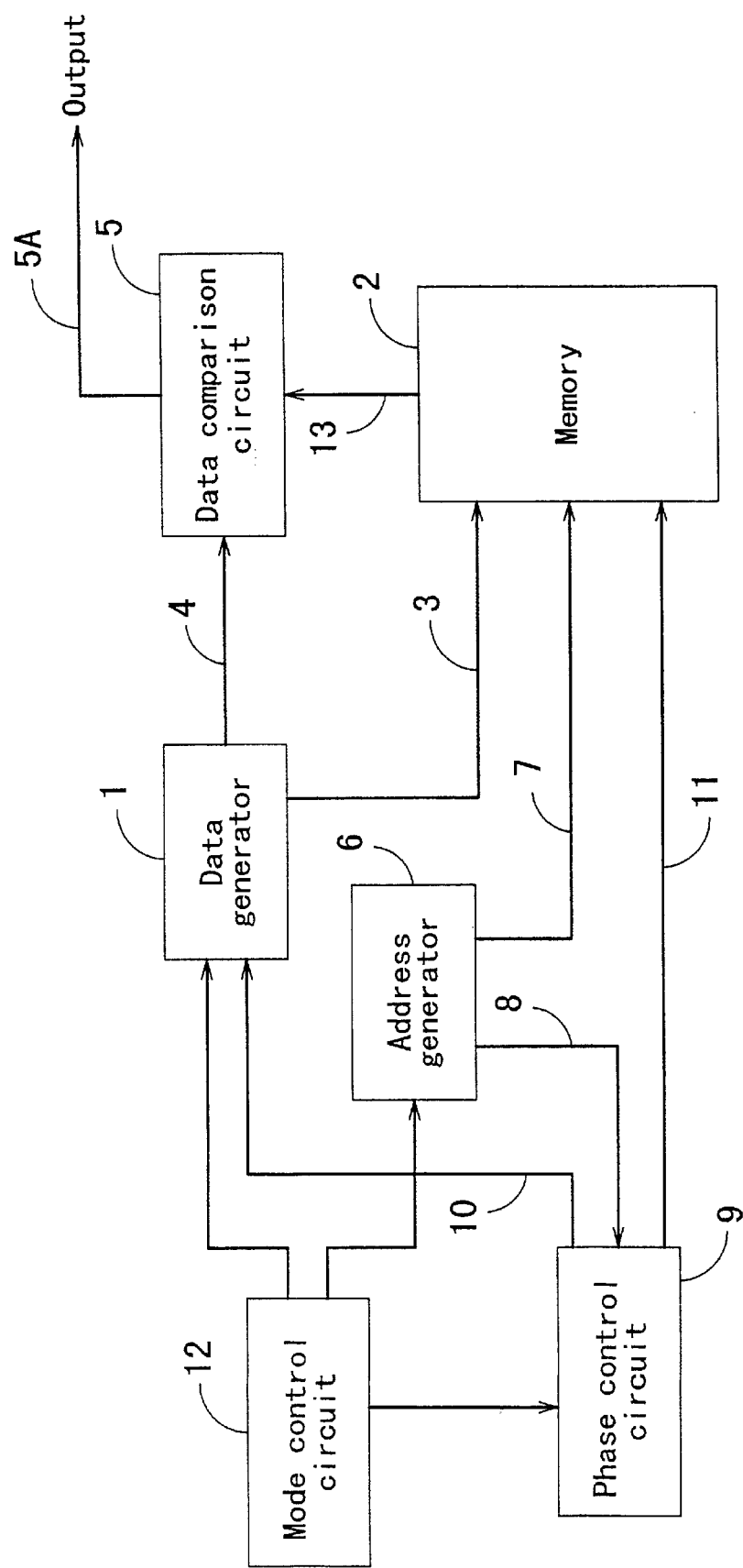
FIG. 13 is a block diagram showing the configuration of a conventional semiconductor integrated circuit device having a memory self-test circuit.
Figure 14:
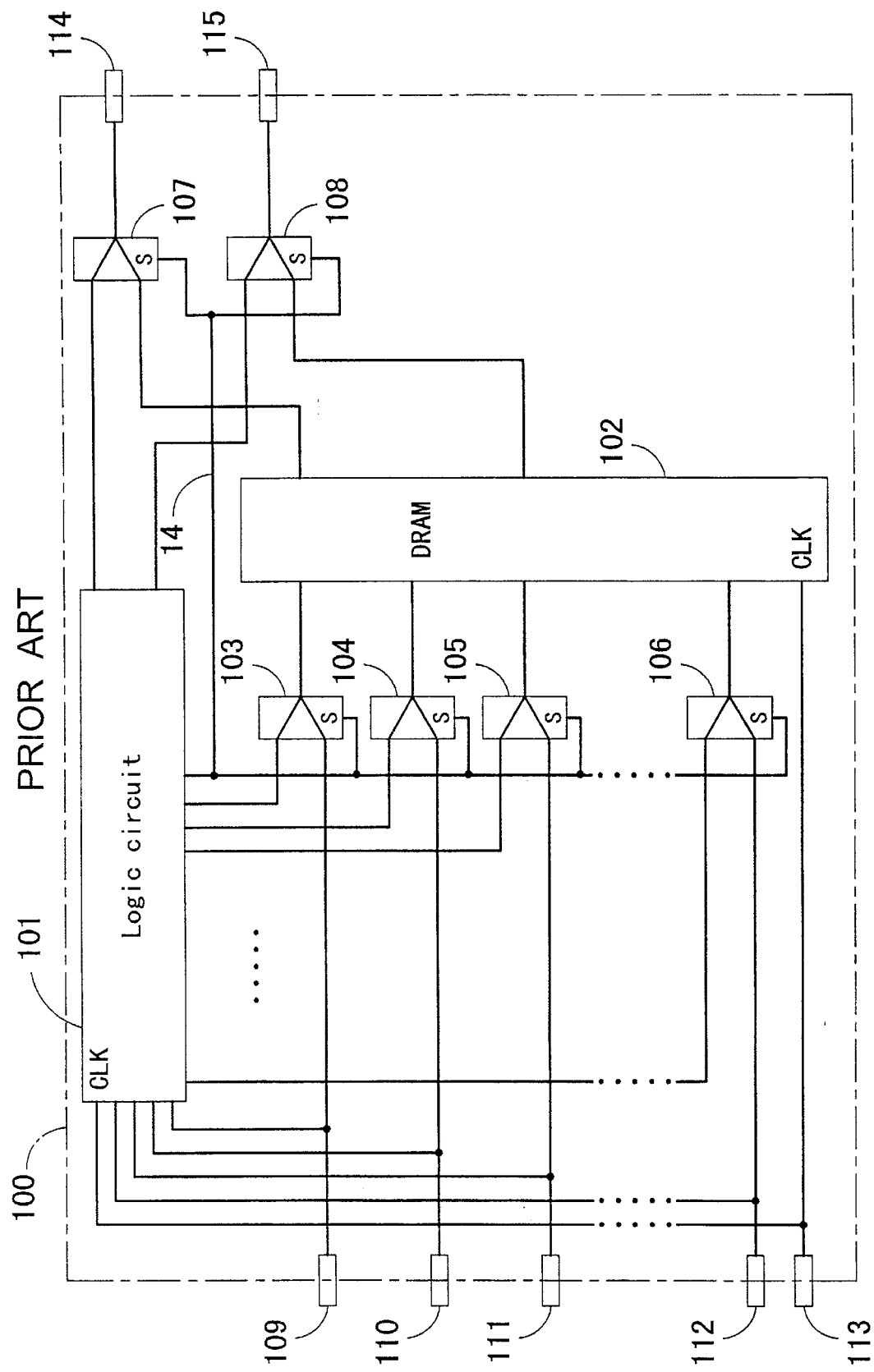
FIG. 14 is a schematic diagram showing the configuration of a conventional system LSI.
Figure 15:
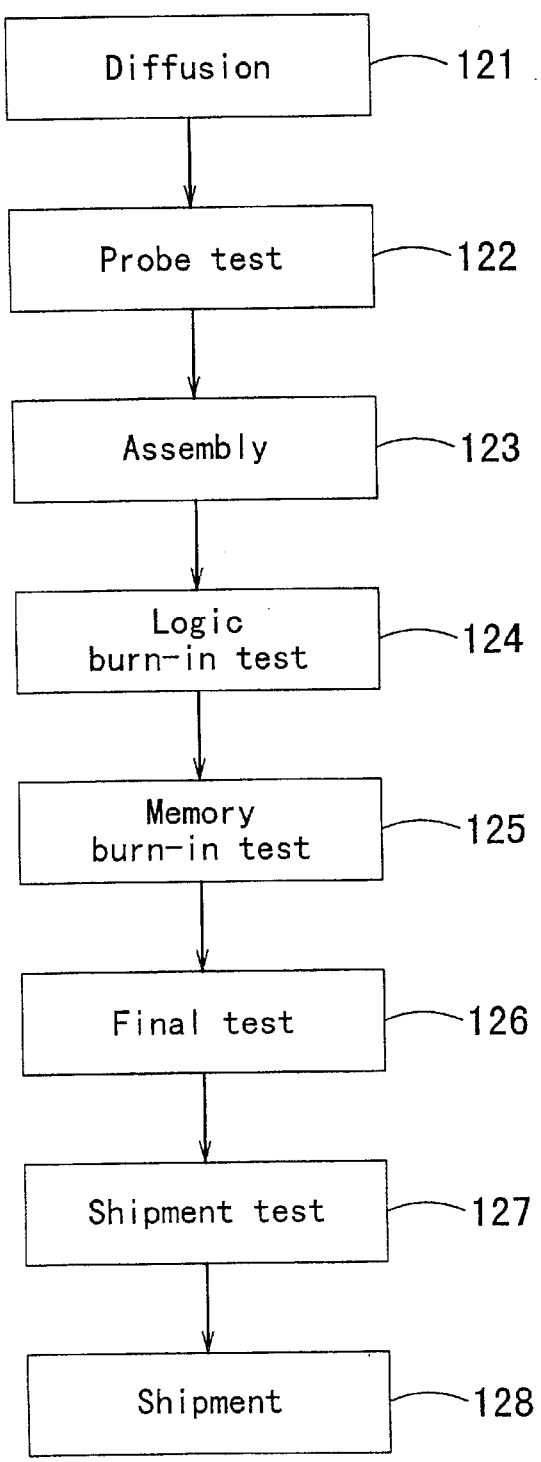
FIG. 15 is a flowchart showing the manufacturing process of a conventional system LSI.

FIG. 12 shows the flow of the manufacturing process of the above-described system LSI. Referring to FIG. 12, a step 181 represents a diffusion step for performing a diffusion process and the like; a step 182 represents a probe test step; a step 183 represents an assembly step for conducting bonding and the like; a step 184 represents a burn-in test step for carrying out the burn-in tests of the logic circuit 171 and the DRAM 172; a step 185 represents a final test step; a step 186 represents a shipment test step; and a step 187 represents a shipment step. FIG. 12 indicates that the number of steps of burn-in tests after assembly is reduced in half as compared with the case of FIG. 15, that is, it is reduced from two steps down to one step, which enables the implementation of the simplification of the manufacturing steps and the simplification and shortening of the test.

What is claimed is:

1. A semiconductor integrated circuit device, comprising:
   a memory;
   a memory self-testing address generator for receiving an external clock, generating a memory self-testing address for testing said memory, and providing said address to said memory, while generating a first control signal for generating memory self-testing data and a phase signal for generating a memory control signal;
   a data generator, coupled to said memory self-testing address generator to receive said first control signal, for generating said memory self-testing data to be written to said memory in a predetermined data pattern corresponding to said first control signal;
   a memory control signal generator for receiving said phase signal and for generating said memory control signal for controlling the write operation of said memory self-testing data to said memory self-testing address of said memory and the read operation of data from said memory self-testing address of said memory; and
   an evaluation circuit, coupled to said memory self-testing address generator to receive said first control signal, for evaluating a pass/fail of a memory actual output data read from said memory, and for outputting a pass/fail flag signal as an evaluation result,
   said evaluation circuit comprising a logic means for receiving said memory actual output data and means for selecting an output from said logic means in response to said first control signal.

2. A semiconductor integrated circuit device according to claim 1, wherein said memory is operated in synchronism with said external clock in normal times, while it is operated in synchronism with the divided-frequency clock obtained by dividing the frequency of said external clock during the memory test.

3. A semiconductor integrated circuit device according to claim 1, wherein said evaluation circuit is so configured as to assume one logic state when said memory actual output data is said predetermined data pattern, and to assume the other logic state when said memory actual output data is a data pattern other than said predetermined data pattern.

4. A semiconductor integrated circuit device according to claim 1, wherein:
   said predetermined pattern comprises a first predetermined data pattern and a second predetermined data pattern obtained by inverting said first predetermined data pattern; and
   said logic means comprises a first logic circuit and a second logic circuit, and
   said means for selecting an output from said logic means comprises a selector, said first logic circuit being so configured as to assume one logic state when said memory actual output data is said first predetermined data pattern, and to assume another logic state when said memory actual output data is a data pattern other than said first predetermined data pattern, said second logic circuit being so configured as to assume one logic state when said memory actual output data is said second predetermined data pattern obtained by inverting the data pattern of said first predetermined data pattern, and to assume another logic state when said memory actual output data is a data pattern other than said second predetermined data pattern, and said selector selecting and outputting any one output of said first and second logic circuits in response to said first control signal for generating said memory self-testing data.

5. A semiconductor integrated circuit device according to claim 1, wherein a non-volatile memory is embedded therein, and the evaluation result of said memory is to be stored in said non-volatile memory.

6. A semiconductor integrated circuit device according to claim 5, wherein only a failing self-test result is written into said non-volatile memory.

7. A semiconductor integrated circuit device according to claim 1, further comprising a mixer circuit for periodically inverting the output of said evaluation circuit by the use of said first control signal for generating memory self-testing data outputted from said memory self-testing address generator.

8. A semiconductor integrated circuit device according to claim 7, wherein said memory is operated in synchronism with said external clock in normal times, while it is operated in synchronism with the divided-frequency clock obtained by dividing the frequency of said external clock during the memory test.

9. A semiconductor integrated circuit device according to claim 7, wherein a non-volatile memory is embedded therein, and a self-test result of said memory is to be stored in said non-volatile memory.

10. A semiconductor integrated circuit device according to claim 9, wherein only a failing self-test result is written into said non-volatile memory.

11. A semiconductor integrated circuit device, comprising:
   a memory circuit and a microcomputer or a logic circuit for performing reading and writing of data from and to said memory circuit in normal times, and providing a self-test enable signal to said memory circuit at the time of test,
   said memory circuit comprising:
      a memory;
      a memory self-testing address generator for receiving an external clock, generating a memory self-testing address for testing said memory, and providing said address to said memory, while generating a first control signal for generating memory self-testing data and a phase signal for generating a memory control signal;
      a data generator, coupled to said memory self-testing address generator to receive said first control signal, for generating said memory self-testing data to be written to said memory in a predetermined data pattern corresponding to said first control signal;
      a memory control signal generator for receiving said phase signal and for generating said memory control signal for controlling the write operation of said memory self-testing data to said memory self-testing address of said memory and the read operation of data from said memory self-testing address of said memory; and
      an evaluation circuit, coupled to said memory self-testing address generator to receive said first control signal, for evaluating a pass/fail of a memory actual output data read from said memory, and outputting a pass/fail flag signal as an evaluation result,
         said evaluation circuit comprising a logic means for receiving said memory actual data, and means for selecting an output from said logic means in response to said first control signal,
         wherein said device is so configured that said memory self-testing address generator, said data generator, said memory control signal generator, and said evaluation circuit are activated in response to said self-test enable signal.

12. A semiconductor integrated circuit device according to claim 11, wherein said evaluation circuit is so configured as to assume one logic state when said memory actual output data is said predetermined data pattern, and to assume the other logic state when said memory actual output data is a data pattern other than said predetermined data pattern.

13. A semiconductor integrated circuit device according to claim 11, wherein:
   said predetermined pattern comprises a first determined data pattern and a second predetermined data pattern obtained by inverting said first predetermined data pattern,
   said logic means comprises a first logic circuit and a second logic circuit, and
   said means for selecting an output from said logic means comprises a selector, said first logic circuit being so configured as to assume one logic state when said memory actual output data is said first predetermined data pattern, and to assume another logic state when said memory actual output data is a data pattern other than said first predetermined data pattern, said second logic circuit being so configured as to assume one logic state when said memory actual output data is said second predetermined data pattern, and to assume another logic state when said memory actual output data is a data pattern other than said second predetermined data pattern, and said selector selecting and outputting any one output of said first and second logic circuits in response to said control signal for generating said memory self-testing data.

14. A semiconductor integrated circuit device, comprising:

a memory;

a memory self-testing address generator for receiving an external clock, generating a memory self-testing address for testing said memory, and providing said address to said memory, while generating a first control signal for generating memory self-testing data and a phase signal for generating a memory control signal;

a data generator, coupled to said memory self-testing address generator to receive said first control signal, for generating said memory self-testing data to be written to said memory in a predetermined data pattern corresponding to said first control signal;

a memory control signal generator for receiving said phase signal and for generating said memory control signal for controlling the write operation of said memory self-testing data to said memory self-testing address of said memory and the read operation of data from said memory self-testing address of said memory; and an evaluation circuit, coupled to said memory self-testing address generator to receive said first control signal, for evaluating, a pass/fail of a memory actual output data read from said memory, and providing an output comprising a pass/fail flag signal as an evaluation result; and a mixer circuit for periodically inverting the output of said evaluation circuit by the use of said first control signal.

15. A semiconductor integrated circuit device according to claim 14, wherein said memory is operated in synchronism with said external clock in normal times, and is operated in synchronism with a divided-frequency clock obtained by dividing the frequency of said external clock during the memory test.

16. A semiconductor integrated circuit device according to claim 14, further comprising a non-volatile memory which is embedded therein, and wherein a self-test of said memory is stored in said non-volatile memory.

17. A semiconductor integrated circuit device according to claim 16, wherein only a failing self-test result is written into said non-volatile memory.

18. A semiconductor integrated circuit device, comprising:

a memory;

a memory self-testing address generator for receiving an external clock, generating a memory self-testing address for testing said memory, and providing said address to said memory, while generating a first control signal for generating memory self-testing data and a phase signal for generating a memory control signal;

a data generator, coupled to said memory self-testing address generator to receive said first control signal, for generating said memory self-testing data to be written to said memory in a predetermined data pattern corresponding to said first control signal;

a memory control signal generator for receiving said phase signal and for generating said memory control signal for controlling the write operation of said memory self-testing data to said memory self-testing address of said memory and the read operation of data from said memory self-testing address of said memory;

an evaluation circuit, coupled to said memory self-testing address generator to receive said first control signal, for evaluating, a pass/fail of a memory actual output data read from said memory, and providing an output comprising a pass/fail flag signal as an evaluation result; and a non-volatile memory which is embedded in said semiconductor integrated circuit device, and wherein a self-test result of said memory is stored in said non-volatile memory.

19. A semiconductor integrated circuit device according to claim 18, wherein only a failing self-test result is written into said non-volatile memory.

20. A semiconductor integrated circuit device, comprising:

a memory;

a memory self-testing address generator for receiving an external clock, generating a memory self-testing address for testing said memory, and providing said address to said memory, while generating a first control signal for generating memory self-testing data and a phase signal for generating a memory control signal;

a data generator, coupled to said memory self-testing address generator to receive said first control signal, for generating said memory self-testing data to be written to said memory in a predetermined data pattern corresponding to said first control signal;

a memory control signal generator for receiving said phase signal and for generating said memory control signal for controlling the write operation of said memory self-testing data to said memory self-testing address of said memory and the read operation of data from said memory self-testing address of said memory; and an evaluation circuit, coupled to said memory self-testing address generator to receive said first control signal, for evaluating, a pass/fail of a memory actual output data read from said memory, and providing an output comprising a pass/fail flag signal as an evaluation result;

wherein said memory is operated in synchronism with said external clock in normal times, while it is operated in synchronism with the divided-frequency clock obtained by dividing the frequency of said external clock during the memory test.

21. A semiconductor integrated circuit device, comprising:

a memory;

a memory self-testing address generator for receiving an external clock, generating a memory self-testing address for testing said memory, and providing said address to said memory, while generating a first control signal for generating memory self-testing data and a phase signal for generating a memory control signal;

a data generator, coupled to said memory self-testing address generator to receive said first control signal, for generating said memory self-testing data to be written to said memory in a predetermined data pattern corresponding to said first control signal;

a memory control signal generator for receiving said phase signal and for generating said memory control signal for controlling the write operation of said memory self-testing data to said memory self-testing address of said memory and the read operation of data from said memory self-testing address of said memory; and an evaluation circuit, coupled to said memory self-testing address generator to receive said first control signal, for evaluating, a pass/fail of a memory actual output data read from said memory, and providing an output comprising a pass/fail flag signal as an evaluation result; and wherein:

said predetermined pattern comprises a first predetermined data pattern and a second predetermined data pattern obtained by inverting said first predetermined data pattern, said logic means comprises a first logic circuit and a second logic circuit, and said means for selecting an output from said logic means comprises a selector, said first logic circuit being so configured as to assume one logic state when said memory actual output data is said first predetermined data pattern, and to assume another logic state when said memory actual output data is a data pattern other than said first predetermined data pattern, said second logic circuit being so configured as to assume one logic state when said memory actual output data is said second predetermined data pattern obtained by inverting the data pattern of said first predetermined data pattern, and to assume another logic state when said memory actual output data is a data pattern other than said second predetermined data pattern, and said selector selecting and outputting any one output of said first and second logic circuits in Response to said first control signal for generating said memory self-testing data.

22. A semiconductor integrated circuit device, comprising:

a memory circuit and a microcomputer or a logic circuit for performing reading and writing of data from and to said memory circuit in normal times, and providing a self-test enable signal to said memory circuit at the time of test, said memory circuit comprising:

a memory;

a memory self-testing address generator for receiving an external clock, generating a memory self-testing address for testing said memory, and providing said address to said memory, while generating a first control signal for generating memory self-testing data and a phase signal for generating a memory control signal;

a data generator, coupled to said memory self-testing address generator to receive said first control signal, for generating said memory self-testing data to be written to said memory in a predetermined data pattern corresponding to said first control signal;

a memory control signal generator for receiving said phase signal and for generating said memory control signal for controlling the write operation of said memory self-testing data to said memory self-testing address of said memory and the read operation of data from said memory self-testing address of said memory; and an evaluation circuit, coupled to said memory self-testing address generator to receive said first control signal, for evaluating a pass/fail of a memory actual output data read from said memory, and outputting a pass/fail flag signal as an evaluation result, wherein:

said device is so configured that said memory self-testing address generator, said data generator, said memory control signal generator, and said evaluation circuit are activated in response to said self-test enable signal, said predetermined pattern comprises a first determined data pattern and a second predetermined data pattern obtained by inverting said first predetermined data pattern, said logic means comprises a first logic circuit and a second logic circuit, and said means for selecting an output from said logic means comprises a selector, said first logic circuit being so configured as to assume one logic state when said memory actual output data is said first predetermined data pattern, and to assume another logic state when said memory actual output data is a data pattern other than said first predetermined data pattern, said second logic circuit being so configured as to assume one logic state when said memory actual output data is said second predetermined data pattern, and to assume another logic state when said memory actual output data is a data pattern other than said second predetermined data pattern, and said selector selecting and outputting any one output of said first and second logic circuits in response to said control signal for generating said memory self-testing data.

* * * * *